(12) United States Patent
Ahn et al.

(10) Patent No.: US 11,631,722 B2
(45) Date of Patent: Apr. 18, 2023

(54) DISPLAY DEVICE

(71) Applicant: Samsung Display Co., LTD., Yongin-si (KR)

(72) Inventors: Jea Heon Ahn, Hwaseong-si (KR); Jeong Ki Kim, Hwaseong-si (KR); Seong Yeon Lee, Asan-si (KR); Si Wan Jeon, Hwaseong-si (KR); Tae Hyung Hwang, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 290 days.

(21) Appl. No.: 17/157,210

(22) Filed: Jan. 25, 2021

(65) Prior Publication Data
US 2021/0384271 A1 Dec. 9, 2021

(30) Foreign Application Priority Data
Jun. 5, 2020 (KR) .................. 10-2020-0068459

(51) Int. Cl.
*H01L 27/32* (2006.01)
*H01L 51/52* (2006.01)
*H01L 51/50* (2006.01)

(52) U.S. Cl.
CPC ........ *H01L 27/3223* (2013.01); *H01L 27/322* (2013.01); *H01L 27/3244* (2013.01); *H01L 51/5044* (2013.01); *H01L 51/5278* (2013.01)

(58) Field of Classification Search
CPC ............... H01L 27/3223; H01L 27/322; H01L 27/3244; H01L 27/326; H01L 51/5044; H01L 51/5278; H01L 51/0031; H01L 51/502; H01L 2251/5369; G09G 3/006; G09G 3/2003; G09G 3/3208; G09G 2300/0413; G09G 2300/0439; G02B 5/201; G02B 5/206
See application file for complete search history.

(56) References Cited

U.S. PATENT DOCUMENTS

2019/0155094 A1   5/2019   Kim et al.
2021/0359009 A1*  11/2021  Lee .................. H01L 51/5253

FOREIGN PATENT DOCUMENTS

JP   2007-187838   7/2007
KR   10-1362022    2/2014

* cited by examiner

*Primary Examiner* — Anne M Hines
*Assistant Examiner* — Jose M Diaz
(74) *Attorney, Agent, or Firm* — Kile Park Reed & Houtteman PLLC

(57) ABSTRACT

A display device includes a first light emitting element on a first substrate and overlapping a first effective pixel area; test light emitting elements on the first substrate and overlapping the test pixel area; a first color filter on a second substrate and overlapping the first light emitting element; a first wavelength conversion pattern on the first color filter and overlapping the first color filter and the first light emitting element; a first test color filter on the second substrate and overlapping one of the test light emitting elements; and a first test wavelength conversion pattern on the second substrate and overlapping another one of the test light emitting elements. The first test wavelength conversion pattern and the first wavelength conversion pattern include a same first wavelength conversion material, and the first test color filter and the first color filter include a same first color colorant.

20 Claims, 15 Drawing Sheets

DISPLAY DEVICE

CROSS REFERENCE TO RELATED APPLICATION(S)

This application claims priority to and benefits of Korean Patent Application No. 10-2020-0068459 under 35 U.S.C. § 119, filed on Jun. 5, 2020, in the Korean Intellectual Property Office, the entire contents of which are incorporated herein by reference.

BACKGROUND

1. Technical Field

The disclosure relates to a display device.

2. Description of the Related Art

The importance of a display device has increased with the development of multimedia. Accordingly, various types of display devices such as a liquid crystal display (LCD) and an organic light emitting display (OLED) have been developed.

Among display devices, a self-light emitting display device may include a self-light emitting element. Illustratively, an organic light emitting display device may include an organic light emitting element that may be a self-light emitting element. The organic light emitting element may include two electrodes facing each other and an organic light emitting layer interposed therebetween. Electrons and holes provided from the two electrodes may be recombined in the organic light emitting layer to generate excitons, and the generated excitons may be shifted from an excited state to a ground state to emit light.

The organic light emitting display device does not need an additional light source to have low power consumption and may be made thin and lightweight, and may have high-level characteristics such as a wide viewing angle, high luminance and contrast, and a rapid response time. Therefore, the organic light emitting display device has attracted considerable attention as a next-generation display device.

Meanwhile, recently, high-performance display devices have been developed, and thus quality control, early detection of defective substrates, and management of device characteristics to prevent process discharge of defective substrates have been required.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device capable of easily monitoring a decrease in efficiency of the display device occurring after a first display substrate and a second display substrate are attached to each other.

However, aspects of the disclosure are not restricted to the ones set forth herein. The above and other aspects of the disclosure will become more apparent to one of ordinary skill in the art to which the disclosure pertains by referencing the detailed description of the disclosure given below.

An embodiment of a display device may include a first substrate including a display area including a first effective pixel area and a non-display area including a test pixel area; a first light emitting element disposed on the first substrate and overlapping the first effective pixel area of the display area; a plurality of test light emitting elements disposed on the first substrate and overlapping the test pixel area of the non-display area; a second substrate facing the first substrate; a first color filter disposed on the second substrate and overlapping the first light emitting element; a first wavelength conversion pattern disposed on the first color filter, the first wavelength conversion pattern overlapping the first color filter and the first light emitting element; a first test color filter disposed on the second substrate and overlapping one of the plurality of test light emitting elements; and a first test wavelength conversion pattern disposed on the second substrate and overlapping another one of the plurality of test light emitting elements, wherein the first test wavelength conversion pattern and the first wavelength conversion pattern include a same first wavelength conversion material, and the first test color filter and the first color filter may include a same first color colorant.

The first test color filter and the first test wavelength conversion pattern may not overlap each other.

The display device may further include a first capping layer disposed on the second substrate, wherein a first portion of the first capping layer overlapping the first effective pixel area may be disposed between the first color filter and the first wavelength conversion pattern, a second portion of the first capping layer overlapping the first test wavelength conversion pattern may be disposed between the second substrate and the first test wavelength conversion pattern, the second portion of the first capping layer may directly contact the second substrate, and a third portion of the first capping layer overlapping the first test color filter may overlap the first test color filter.

The display device may further include a second capping layer overlapping the first wavelength conversion pattern and the first test wavelength conversion pattern, wherein a portion of the second capping layer overlapping the first test color filter may directly contact the first capping layer.

The display device may further include a light blocking layer disposed on the second substrate, wherein the light blocking layer may be disposed between the first test wavelength conversion pattern and the first test color filter.

The test pixel area of the non-display area may include a first dummy pixel area overlapping the first test wavelength conversion pattern, a second dummy pixel area overlapping the first test color filter, and a third dummy pixel area overlapping the first test wavelength conversion pattern and the first test color filter.

The display device may further include a first capping layer disposed on the second substrate and overlapping the first test color filter and the first color filter; and a second capping layer disposed on the first capping layer, the second capping layer overlapping the first test wavelength conversion pattern and the first wavelength conversion pattern; and a test light emitting element disposed on the first substrate and overlapping the third dummy pixel area, wherein a portion of the first capping layer overlapping the third dummy pixel area may directly contact the second substrate, and a portion of the second capping layer overlapping the third dummy pixel area may directly contact the first capping layer.

The display area may further include a second effective pixel area, the first dummy pixel area may include a first sub-dummy pixel area, and a second sub-dummy pixel area, and the display device may further include a second wavelength conversion pattern disposed on the second substrate and overlapping the second effective pixel area; a second test wavelength conversion pattern disposed on the second substrate and overlapping the second sub-dummy pixel area; a test light emitting element disposed on the first substrate and overlapping the second test wavelength conversion pattern; and a second light emitting element disposed on the first substrate and overlapping the second wavelength conversion pattern, wherein the second wavelength conversion pattern and the second test wavelength conversion pattern may include a same second wavelength conversion material that may be different from the first wavelength conversion material.

The second dummy pixel area may include a third sub-dummy pixel area and a fourth sub-dummy pixel area, the display device may further include a second color filter overlapping the second wavelength conversion pattern and disposed between the second substrate and the second wavelength conversion pattern; a second test color filter disposed on the second substrate and overlapping the fourth sub-dummy pixel area; and a test light emitting element disposed on the first substrate and overlapping the second test color filter, wherein the second color filter and the second test color filter may include a same second color colorant that may be different from the first color colorant.

The first dummy pixel area may further include a fifth sub-dummy pixel area, the display area may further include a third effective pixel area, the display device may further include a light transmission pattern disposed on the second substrate and overlapping the third effective pixel area; a test light transmission pattern disposed on the second substrate and overlapping the fifth sub-dummy pixel area; a test light emitting element disposed on the first substrate and overlapping the test light transmission pattern; and a third light emitting element disposed on the first substrate and overlapping the light transmission pattern, and each of the test light transmission pattern and the light transmission pattern may include a base resin and scatterers dispersed in the base resin.

The second dummy pixel area may further include a sixth sub-dummy pixel area, the display device may further include a third color filter overlapping the light transmission pattern and disposed between the second substrate and the light transmission pattern; a third test color filter disposed on the second substrate and overlapping the sixth sub-dummy pixel area; and a test light emitting element disposed on the first substrate and overlapping the third test color filter, and the third color filter and the third test color filter may include a same third color colorant that may be different from the first color colorant and the second color colorant.

Each of the plurality of test light emitting elements and the first light emitting element may include a light emitting layer, and the light emitting layer may emit blue light.

The first wavelength conversion material may include quantum dots, each of the test light conversion pattern and the first wavelength conversion pattern may include a base resin and scatterers dispersed in the base resin, and the quantum dots may be dispersed in the base resin.

The display device may further include a sealing member surrounding the display area, wherein the non-display area may include a first non-display area disposed inside the sealing member; and a second non-display area disposed outside the sealing member, and the test pixel area may be disposed in each of the first non-display area and the second non-display area.

The display device may further include a filling layer disposed between the first substrate and the second substrate, wherein the filling layer may overlap the first non-display area, and the filling layer may not overlap the second non-display area.

An embodiment of a display device may include a first substrate including a display area including an effective pixel area and a non-display area including a test pixel area; a light emitting layer disposed on the first substrate and overlapping the test pixel area; a second substrate facing the first substrate; a color filter disposed on the second substrate and overlapping the effective pixel area; a first capping layer disposed on the color filter and overlapping the color filter; a wavelength conversion pattern disposed on the first capping layer and overlapping the color filter; and a test color filter and a test wavelength conversion pattern disposed on the second substrate and overlapping the test pixel area, wherein the test color filter may not overlap the test wavelength conversion pattern, a portion of the first capping layer overlapping the test wavelength conversion pattern may directly contact the second substrate, and a portion of the first capping layer overlapping the test color filter may not contact the second substrate.

The test color filter and the color filter may include a same material, and the test wavelength conversion pattern and the wavelength conversion pattern may include a same material.

The display device may further include a second capping layer overlapping the wavelength conversion pattern and the test wavelength conversion pattern, wherein a portion of the second capping layer overlapping the test wavelength conversion pattern may directly contact the test wavelength conversion pattern, and a portion of the second capping layer overlapping the test color filter may directly contact the first capping layer.

The test pixel area may include a first dummy pixel area overlapping the test wavelength conversion pattern; a second dummy pixel area overlapping the test color filter; and a third dummy pixel area not overlapping the test wavelength conversion pattern and the test color filter, a portion of the first capping layer overlapping the third dummy pixel area may directly contact the second substrate, and a portion of the second capping layer overlapping the third dummy pixel area may directly contact the first capping layer.

The test wavelength conversion pattern and the wavelength conversion pattern may include same quantum dots, and the light emitting layer may emit blue light.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
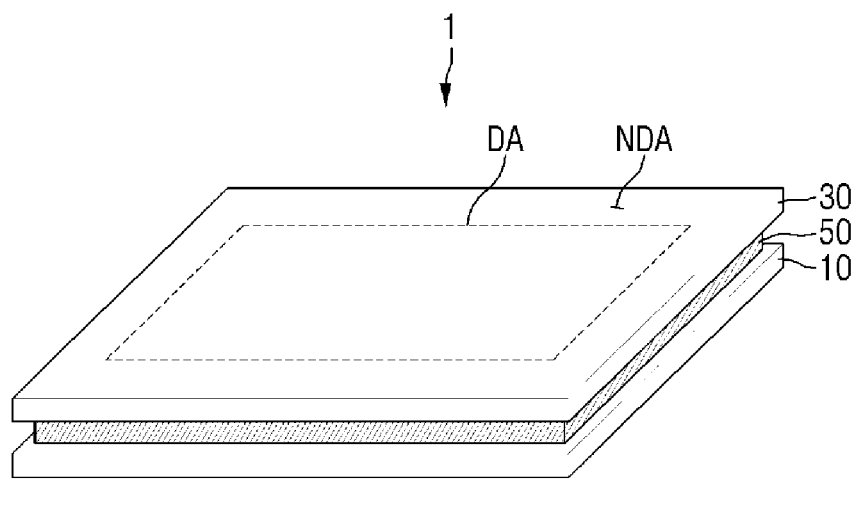
FIG. 1 is a perspective view of a display device according to an embodiment.
Figure 1:
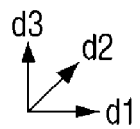

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art. The same reference numbers indicate the same components throughout the specification. In the attached figures, the thickness of layers and regions is exaggerated for clarity.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

The terminology used herein is for the purpose of describing embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," "includes" and/or "including", "have" and/or "having" and their variations when used in this specification, specify the presence of stated features, integers, steps, operations, elements, and/or components, but do not preclude the presence or addition of one or more other features, integers, steps, operations, elements, components, and/or groups thereof.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure.

Also, "under", "below", "above", "upper", and the like are used for explaining relation association of components illustrated in the drawings. The terms may be a relative concept and described based on directions expressed in the drawings.

It will be understood that when a layer, region, or element is referred to as being "connected," the layer, the region, or the element may be directly connected or may be indirectly connected with intervening layers, regions, or elements therebetween. For example, when a layer, a region, or an element is electrically connected, the layer, the region, or the element may be directly electrically connected and/or may be indirectly electrically connected with intervening layers, regions, or elements therebetween.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Embodiments are described herein with reference to plan and cross-section illustrations that are schematic illustrations of embodiments of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the disclosure.

Hereinafter, embodiments of the disclosure will be described with reference to the attached drawings.

Figure 2:
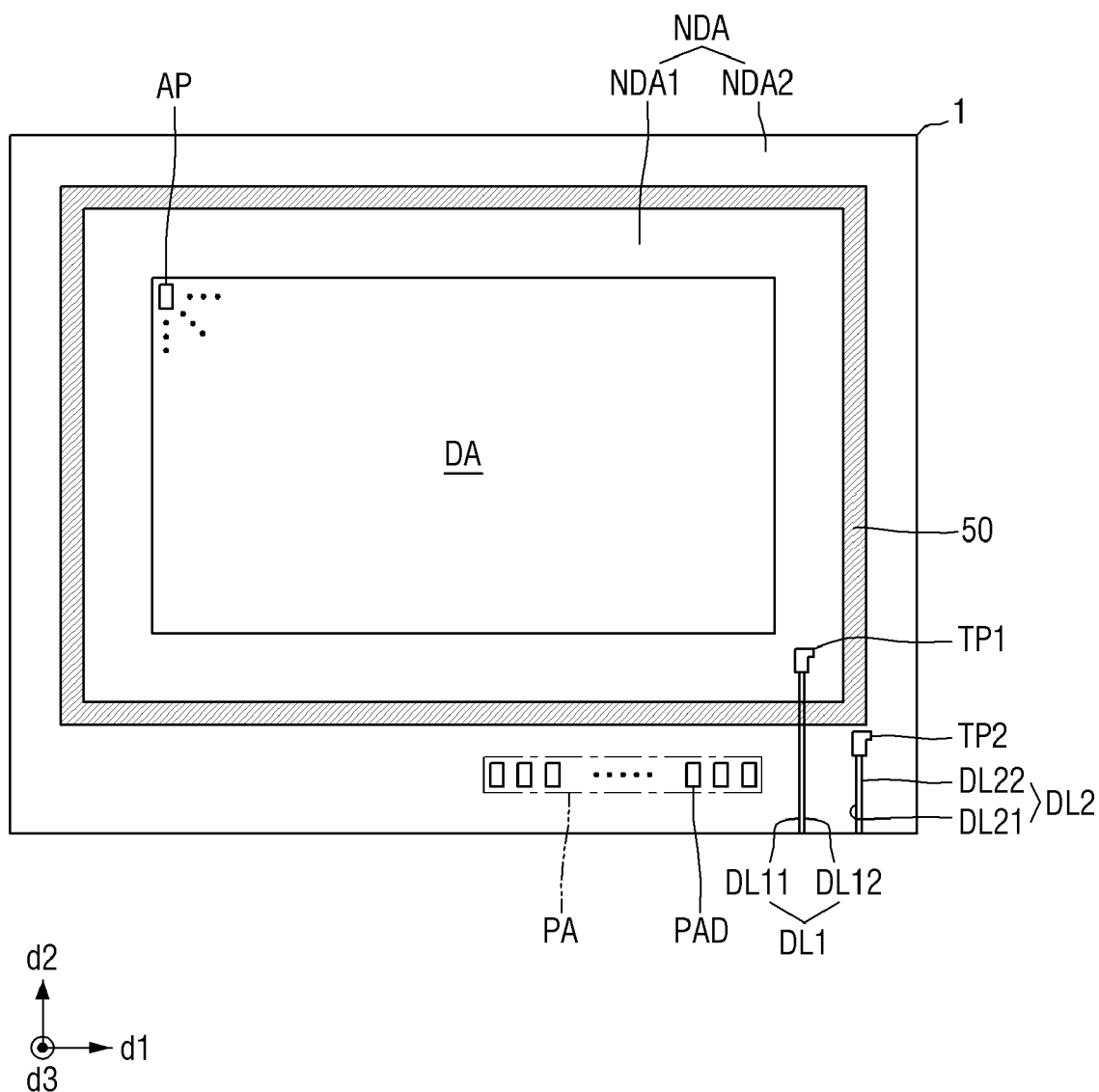
FIG. 2 is a plan view of a display device according to an embodiment.

FIG. 1 is a perspective view of a display device according to an embodiment, and FIG. 2 is a plan view of a display device according to an embodiment.

Referring to FIGS. 1 and 2, a display device 1 may be applied to various electronic appliances such as tablet PCs, smart phones, car navigation units, cameras, center information displays (CIDs) for vehicles, wrist watch-type electronic devices, personal digital assistants (PDAs), portable multimedia players (PMPs), game machines, televisions, outside billboards, monitors, personal computers, and notebook computers by way of non-limiting examples. These appliances are provided only as examples, and it should be understood that this display device may be applied to other electronic appliances as long as it does not depart from the spirit and scope of the disclosure.

The display device 1 may have a substantially rectangular shape in a plan view. The display device 1 may include both first sides extending in a first direction d1 and both second sides extending in a second direction d2 crossing or intersecting the first direction d1. The corner where the first side and second side of the display device 1 meet each other may be a right angle, but is not limited thereto, and may have a substantially curved surface. The planar shape of the display device 1 is not limited to the one illustrated in FIG. 1, and the planar shape of the display device 1 may have a substantially circular shape or other different shapes.

Unless otherwise defined, as used herein, the "on", "over", "top", "upper side", or "upper surface" refers to a direction of an arrow in a third direction d3 intersecting the first direction d1 and the second direction d2, with respect to the drawing, and the terms "beneath", "under", "bottom", "lower side", or "lower surface" refers to a direction opposite to the direction of the arrow in the third direction d3.

The display device 1 may include a first display substrate 10, a second display substrate 30, a sealing member 50, and a filling layer 70.

The first display substrate 10 may include elements and circuits for displaying an image, for example, switching elements and pixel circuits, a pixel defining layer defining a light emission area and a non-light emission area, which will be described later, in a display area DA, and a self-light emitting element. In an embodiment, the self-light emitting element may include at least one of an organic light emitting diode, a quantum dot light emitting diode, an inorganic material-based micro light emitting diode (micro LED), and an inorganic material-based nano light emitting diode (nano LED). Hereinafter, a case where the self-light emitting element may be an organic light emitting element will be mainly described.

The second display substrate 30 may be located or disposed on the first display substrate 10 and may face the first display substrate 10. The second display substrate 30 may include a color conversion pattern that may convert the color of incident light. The color conversion pattern may include at least one of a color filters and a wavelength conversion pattern.

The sealing member 50 may be located or disposed between the first display substrate 10 and the second display substrate 30. The sealing member 50 may be disposed along the edges of the first display substrate 10 and the second display substrate 30 in the non-display area NDA. The first display substrate 10 and the second display substrate 30 may be coupled or connected to each other through the sealing member 50. The sealing member 50 may be made of an organic material. The organic material may be, for example, an epoxy resin, but is not limited thereto.

The filling layer 70 may be located or disposed in a space between the first display substrate 10 and the second display substrate 30 surrounded by the sealing member 50. The filling layer 70 may fill the space between the first display substrate 10 and the second display substrate 30. The filling layer 70 may be made of a material that may transmit light. In an embodiment, the filling layer 70 may be made of an organic material. Examples of the organic material may include, but are not limited to, silicon-based organic materials and epoxy-based organic materials. In an embodiment, the filling layer 70 may be omitted. Hereinafter, a case where the display device 1 may include the filling layer 70 will be described as an example.

The display device 1 may include a display area DA and a non-display area NDA. The display area DA may include a plurality of effective pixel areas AP, and an image may be displayed by light emitted from the effective pixel areas AP. Details of the effective pixel areas AP will be described later.

The non-display area NDA may be located or disposed around the display area DA, and may surround or may be adjacent to the display area DA.

The non-display area NDA may include a first non-display area NDA1 and a second non-display area NDA2. The first non-display area NDA1 and the second non-display area NDA2 may be based on the sealing member 50. For example, the first non-display area NDA1 may be an area located or disposed inside the sealing member 50 in the non-display area NDA, and the second non-display area NDA2 may be an area located or disposed outside the sealing member 50 in the non-display area NDA. For example, the first non-display area NDA1 may be located or disposed between the display area DA and the sealing member 50, and the sealing member 50 may be located or disposed between the first non-display area NDA1 and the second non-display area NDA2.

The non-display area NDA may include a pad area PA in which a plurality of pads PAD may be arranged or disposed and a plurality of test pixel areas TP1 and TP2.

The pad area PA may be located or disposed in the second non-display area NDA2. In other words, the second non-display area NDA2 may include the pad area PA. In the drawing, a case where the pad area PA may be located or disposed at the lower side of the display area DA in the second non-display areas NDA2 is illustrated, but the disclosure is not limited thereto. For example, the pad area PA may be located or disposed at the upper side of the display area DA in the second non-display areas NDA2, and may also be located or disposed in the second non-display area NDA2 at the upper and lower sides of the display area DA. For example, the location of the pad area PA may be variously changed.

The test pixel areas TP1 and TP2 may include a first test pixel area TP1 and a second test pixel area TP2. The first test pixel area TP1 may be located or disposed in the first non-display area NDA1, and the second test pixel area TP2 may be located or disposed in the second non-display area NDA2. In other words, the first non-display area NDA1 may include the first test pixel area TP1, and the second non-display area NDA2 may include the second test pixel area TP2. Therefore, the sealing member 50 may be located or disposed between the first test pixel area TP1 and the second test pixel area TP2.

In an embodiment, a plurality of dummy lines DL1 and DL2 may be arranged or disposed in the non-display area NDA.

The first dummy line DL1 may be electrically connected to a component located or disposed in the first test pixel area TP1, and the component may receive an inspection signal from the first dummy line DL1. Accordingly, characteristics of a test light emitting element ED, a light transmission pattern 341, wavelength conversion patterns 343 and, 345, and color filters 331, 333, and 335, which will be described later, may be measured. The first dummy line DL1 may include a first inspection line DL11 and a second inspection line DL12. The first inspection line DL11 of the first dummy line DL1 may be electrically connected to a dummy anode electrode DAE, which will be described later, located or disposed in the first test pixel area TP1, and the second inspection line DL12 of the first dummy line DL1 may be electrically connected to a second electrode layer CE in the first test pixel area TP1.

Similarly, the second dummy line DL2 may be electrically connected to a component located or disposed in the second test pixel area TP2, and the component may receive an inspection signal from the second dummy line DL2. Accordingly, characteristics of a test light emitting element ED, a light transmission pattern 341, wavelength conversion patterns 343 and, 345, and color filters 331, 333, and 335, which will be described later, may be measured. The second dummy line DL2 may include a first inspection line DL21 and a second inspection line DL22. The first inspection line DL21 of the second dummy line DL2 may be electrically connected to a dummy anode electrode DAE, which will be described later, located or disposed in the second test pixel area TP2, and the second inspection line DL22 of the second dummy line DL2 may be electrically connected to a second electrode layer CE in the second test pixel area TP2. A separate signal or voltage, except for the inspection signal provided during light emission inspection, may not be applied to the above-described dummy lines DL1 and DL2.

Meanwhile, although not shown in the drawing, each of the dummy lines DL1 and DL2 may be electrically connected to a separate test pad to receive a test signal from the test pad. The inspection pad may be disposed in the non-display area NDA of the display device 1. However, the disclosure is not limited thereto, and the inspection pad may be disposed on a mother substrate of the display device 1 or may be disposed in a dummy area that may be cut after inspection.

Meanwhile, a case where the test pixel areas TP1 and TP2 may be located or disposed on one or a side of the display device 1 is illustrated in FIG. 2, but the arrangement of the test pixel areas TP1 and TP2 is not limited thereto. For example, the test pixel areas TP1 and TP2 may be located or disposed at the other or another side of the display device 1.

Alternatively, the first test pixel area TP1 may be located or disposed at one or a side of the display device 1, and the second test pixel area TP2 may be located or disposed at the other or another side of the display device 1. Details of the test pixel areas TP1 and TP2 will be described later.

Figure 3:
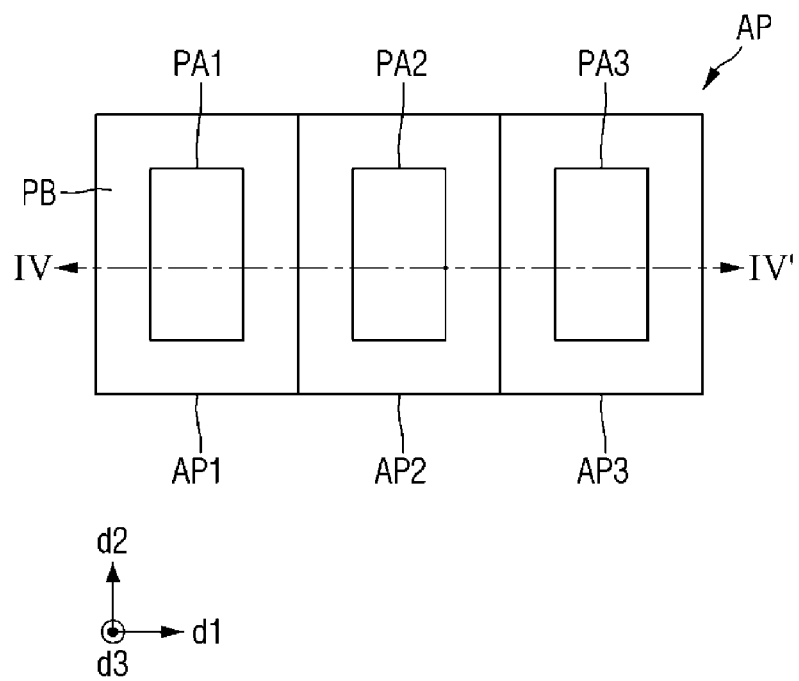
FIG. 3 is an enlarged plan view of the effective pixel area in FIG. 2.
Figure 4:
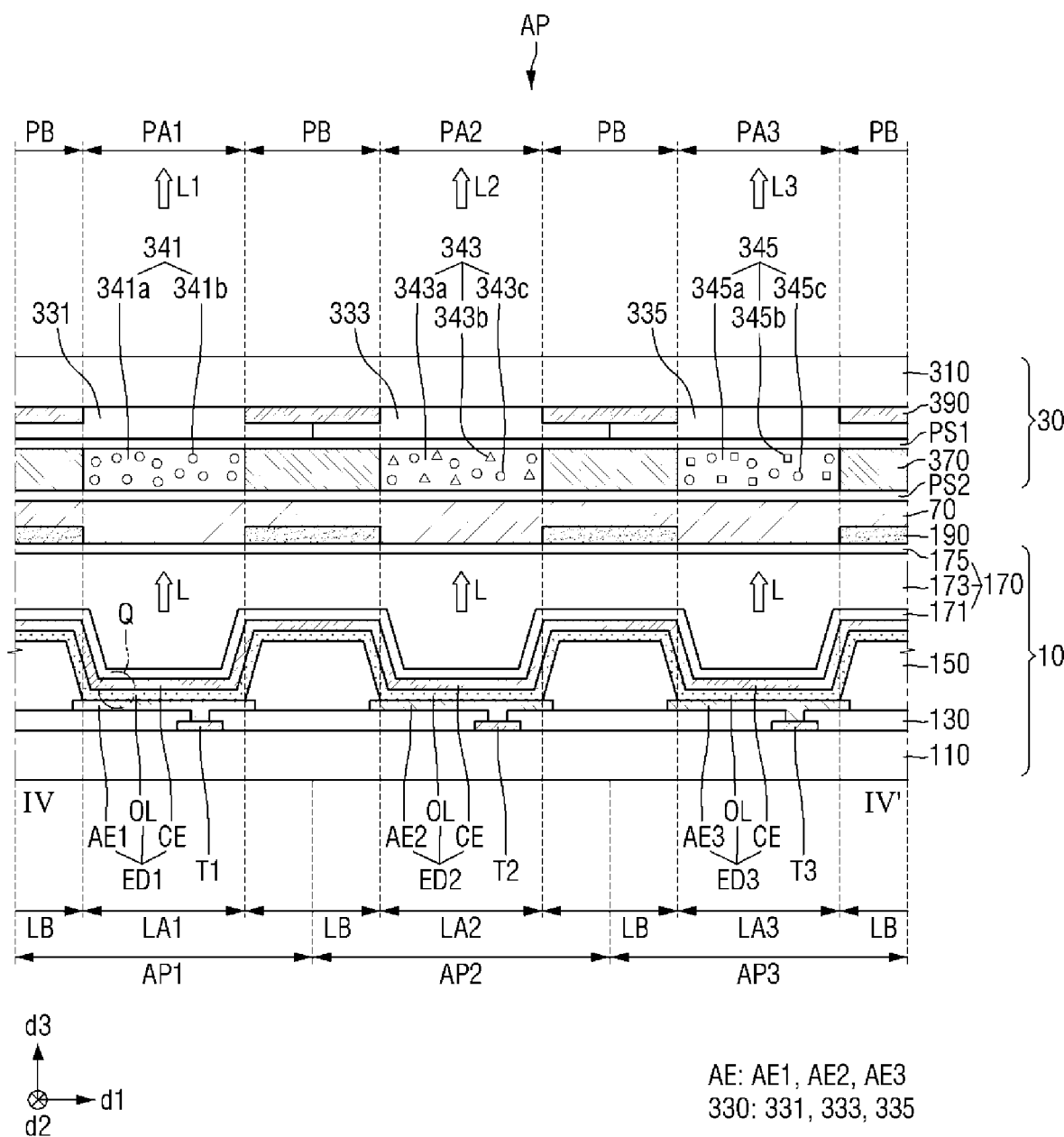
FIG. 4 is a schematic cross-sectional view taken along the line IV-IV' in FIG. 3.
Figure 5:
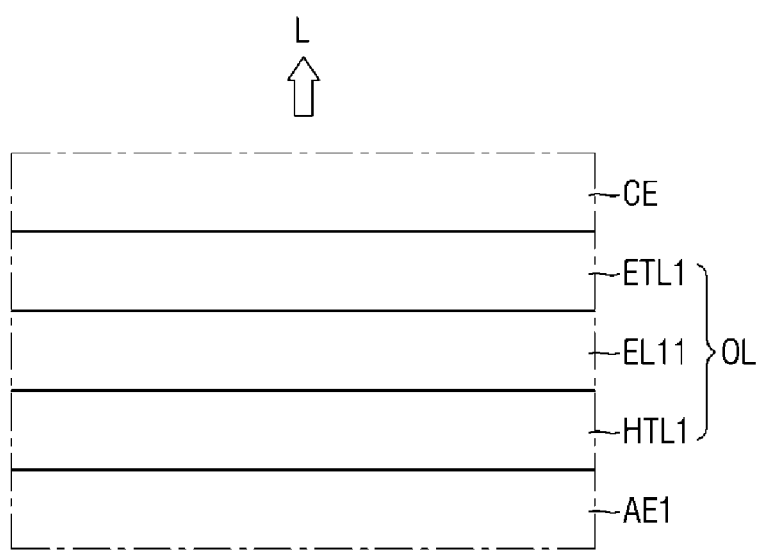
FIG. 5 is an enlarged schematic cross-sectional view of the portion Q in FIG. 4.
Figure 6:
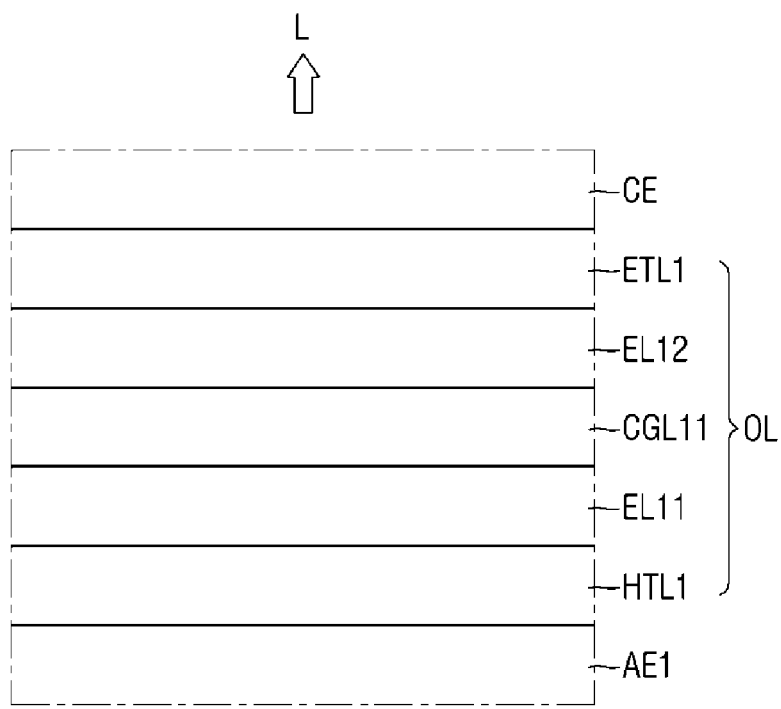
FIGS. 6 and 7 are schematic cross-sectional views showing modification examples of the structure shown in FIG. 5.
Figure 7:
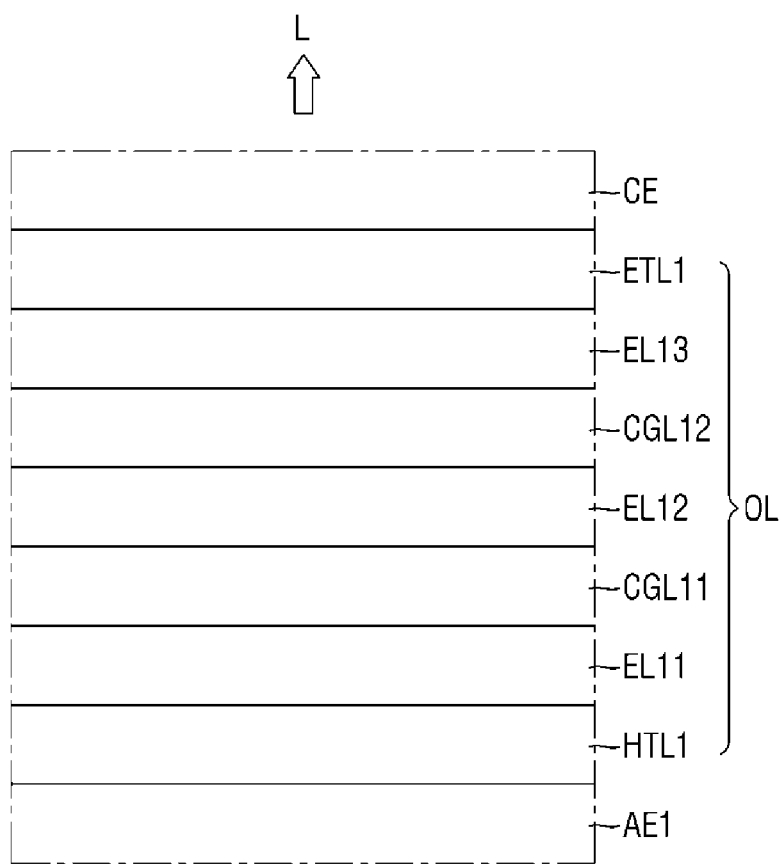

FIG. 3 is an enlarged plan view of the effective pixel area in FIG. 2, FIG. 4 is a schematic cross-sectional view taken along the line IV-IV' in FIG. 3, FIG. 5 is an enlarged schematic cross-sectional view of the portion Q in FIG. 4, and FIGS. 6 and 7 are schematic cross-sectional views showing modification examples of the structure shown in FIG. 5.

Referring to FIGS. 2 to 7, the display area DA of the display device 1 may include a plurality of effective pixel areas AP.

The plurality of effective pixel areas AP may include a first effective pixel area AP1, a second effective pixel area AP2 and a third effective pixel area AP3. In an embodiment, the first effective pixel area AP1, the second effective pixel area AP2, and the third effective pixel area AP3 may form one group, and may be repeatedly arranged or disposed in the first direction d1 or the second direction d2.

In an embodiment, the first effective pixel area AP1, the second effective pixel area AP2, and the third effective pixel area AP3 may be sequentially arranged or disposed along one direction, for example, the first direction d1. However, the disclosure is not limited thereto, and the first effective pixel area AP1, the second effective pixel area AP2, and the third effective pixel area AP3 may be arranged or disposed to form a pentile structure.

In an embodiment, the first effective pixel area AP1, the second effective pixel area AP2, and the third effective pixel area AP3 may be defined in the first display substrate 10.

In an embodiment, the first effective pixel area AP1 may include a first light emission area LA1 and a non-light emission area LB surrounding the first light emission area LA1, the second effective pixel area AP2 may include a second light emission area LA2 and a non-light emission area LB surrounding the second light emission area LA2, and the third effective pixel area AP3 may include a third light emission area and a non-light emission area LB surrounding the third light emission area LA3. The first light emission area LA1, the second light emission area LA2, and the third light emission area LA3 may be areas in which light L may be emitted from a light emitting layer. The non-light emission area LB may be an area in which the light emitting layer may not emit light. The non-light emission area LB may be disposed to surround each of the first light emission area LA1, the second light emission area LA2, and the third light emission area LA3. Each of the first light emission area LA1, the second light emission area LA2, and the third light emission area LA3 and the non-light emission area LB may be defined by a pixel defining layer 150, which will be described later. Each of the first light emission area LA1, the second light emission area LA2, and the third light emission area LA3 and the non-light emission area LB may be arranged or disposed in the first display substrate 10.

In the display area DA, the first light transmission area PA1, the second light transmission area PA2, the third light transmission area PA3, and the light blocking area PB may be arranged or disposed in the second display substrate 30.

An area surrounding the first light transmission area PA1 of the first light transmission area PA1 and the light blocking area PB may overlap the first effective pixel area AP1. In an embodiment, the first light transmission area PA1 may overlap the first light emission area LA1. An area surrounding the second light transmission area PA2 of the second light transmission area PA2 and the light blocking area PB may overlap the second effective pixel area AP2. In an embodiment, the second light transmission area PA2 may overlap the second light emission area LA2. An area surrounding the third light transmission area PA3 of the third light transmission area PA3 and the light blocking area PB may overlap the third effective pixel area AP3. In an embodiment, the third light transmission area PA3 may overlap the third light emission area LA3. The light blocking area PB may overlap the non-light emission area LB.

Each of the first light transmission area PA1, the second light transmission area PA2, and the third light transmission area PA3 may be an area in which light emitted from the first display substrate 10 may pass through the second display substrate 30 and may be provided to the outside of the display device 1. By way of example, in the first light transmission area PA1, first emission light L1 of a first color may be provided to the outside the display device 1, in the second light transmission area PA2, second emission light L2 of a second color may be provided to the outside the display device 1, and in the third light transmission area PA3, third emission light L3 of a third color may be provided to the outside the display device 1.

In an embodiment, the first emission light L1 of the first color may be a blue light having a peak wavelength in a range of about 430 nm to about 470 nm, the second emission light L2 of the second color may be a red light having a peak wavelength in a range of about 610 nm to about 650 nm, and the third emission light L3 of the third color may be a green light having a peak wavelength in a range of about 510 nm to about 550 nm.

The light blocking area PB may be an area in which light emitted from the first display substrate 10 may not transmit. The light blocking area PB may be disposed to surround the first light transmission area PA1, the second light transmission area PA2, and the third light transmission area PA3. In an embodiment, the first light transmission area PA1, the second light transmission area PA2, the third light transmission area PA3, and the light blocking area PB may be defined by a light blocking layer 390 to be described later.

The light L emitted from the first light emission area LA1, the second light emission area LA2, and the third light emission area LA3 may all have the same peak wavelength, but may be color-converted by the wavelength conversion patterns 343 and 345 and/or the color filter layer 330 to be emitted to the outside of the display device 1. Details thereof will be described later.

The cross-sectional structure of the display device 1 in the effective pixel area AP will be described in more detail with reference to FIG. 4.

Referring to FIG. 4, the first display substrate 10 may include a first substrate 110, a plurality of switching elements T1, T2, and T3, an insulating layer 130, a pixel defining layer 150, and a plurality of light emitting elements ED1, ED2, and ED3.

The first substrate 110 may be made of a light-transmitting material. The first substrate 110 may be a glass substrate or a plastic substrate. In a case that the first substrate 110 is a plastic substrate, the first substrate 110 may have flexibility.

The first switching element T1, the second switching element T2, and the third switching element T3 may be located or disposed on the first substrate 110. Each of the first switching element T1, the second switching element T2, and the third switching element T3 may be a thin film transistor. In an embodiment, each of the first switching element T1, the second switching element T2, and the third switching element T3 may be a thin film transistor including polysilicon or a thin film transistor including an oxide semiconductor. The first switching element T1 may overlap the first effective pixel area AP1, the second switching element T2 may overlap the second effective pixel area AP2, and the third switching element T3 may overlap the third effective pixel area AP3. For example, although not shown in the drawing, a plurality of signal lines for transmitting signals to the first switching element T1, the second switching element T2, and the third switching element T3, for example, a gate line, a data line, and a power line, may be arranged or disposed on the first substrate 110.

The insulating layer 130 may be disposed on the first switching element T1, the second switching element T2, and the third switching element T3. In an embodiment, the insulating layer 130 may be made of an organic material. Examples of the organic material may include, but are not limited to, an acrylic resin, an epoxy resin, an imide resin, and an ester resin. In an embodiment, the upper surface of the insulating layer 130 may be flat.

A first electrode layer AE may be disposed on the insulating layer 130. The first electrode layer AE may overlap the first light emission area LA1, the second light emission area LA2, and the third light emission area LA3, and may at least partially overlap the non-light emission area LB.

In an embodiment, the first electrode layer AE may have reflectivity. In this case, the first electrode layer AE may be a metal layer including a metal such as Ag, Mg, Al, Pt, Pd, Au, Ni, Nd, Ir, or Cr. Alternatively, the first electrode layer AE may include a metal oxide layer disposed on the metal layer. In an embodiment, the first electrode layer AE may have a multi-layer structure, for example, a two-layer structure of ITO/Ag, Ag/ITO, ITO/Mg, or ITO/MgF, or a three-layer structure of ITO/Ag/ITO.

The first electrode layer AE may include a first anode electrode AE1, a second anode electrode AE2, and a third anode electrode AE3. The first anode electrode AE1 may overlap the first effective pixel area AP1, the second anode electrode AE2 may overlap the second effective pixel area AP2, and the third anode electrode AE3 may overlap the third effective pixel area AP3.

The first anode electrode AE1 may overlap the first light emission area LA1, and at least a part of the first anode electrode AE1 may extend to the non-light emission area LB. The second anode electrode AE2 may overlap the second light emission area LA2, and at least a part of the second anode electrode AE2 may extend to the non-light emission area LB. The third anode electrode AE3 may overlap the third light emission area LA3, and at least a part of the third anode electrode AE3 may extend to the non-light emission area LB. The first anode electrode AE1 may penetrate the insulating layer 130 to be electrically connected to the first switching element T1, the second anode electrode AE2 may penetrate the insulating layer 130 to be electrically connected to the second switching element T2, and the third anode electrode AE3 may penetrate the insulating layer 130 to be electrically connected to the third switching element T3.

The pixel defining layer 150 may be disposed on the first electrode layer AE. The pixel defining layer 150 may be disposed along the boundaries among the first effective pixel area AP1, the second effective pixel area AP2, and the third effective pixel area AP3. In an embodiment, the pixel defining layer 150 may be disposed to overlap the non-light emission area LB or the light blocking area PB. The pixel defining layer 150 may be formed in a lattice shape, and may include an opening partially exposing the first anode electrode AE1, the second anode electrode AE2, and the third anode electrode AE3. The opening of the pixel defining layer 150 may define the first light emission area LA1, the second light emission area LA2, and the third light emission area LA3, and the area overlapping the pixel defining layer 150 may be defined as the non-light emission area LB.

The pixel defining layer 150 may include an organic insulating material such as an acrylic resin, an epoxy resin, a phenol resin, a polyamide resin, a polyimide resin, an unsaturated polyester resin, a polyphenylene resin, a polyphenylene sulfide resin, or benzocyclobutene.

The pixel defining layer 150 may partially overlap a light blocking layer 390 and a partition wall 370 in the thickness direction. Details thereof will be described later.

A light emitting layer OL may be disposed on the pixel defining layer 150 and the first electrode layer AE. The light emitting layer OL may overlap the first effective pixel area AP1, the second effective pixel area AP2, and the third effective pixel area AP3. The light emitting layer OL may have a shape of a continuous film formed or disposed to overlap the first light emission area LA1, the second light emission area LA2, the third light emission area LA3, and the non-light emission area LB. The light emitting layer OL will be described in more detail with reference to FIGS. 5 to 7.

The light emitting layer OL may have a structure in which a plurality of layers may be stacked. For example, as shown in FIG. 5, the light emitting layer OL may include a first hole transport layer HTL1, a first light emitting material layer EL11, and a first electron transport layer ETL1. The first hole transport layer HTL1 may be disposed on the first anode electrode AE1, the first light emitting material layer EL11 may be disposed on the first hole transport layer HTL1, and the first electron transport layer ETL1 may be disposed on the first light emitting material layer EL11. The first light emitting material layer EL11 may emit blue light, but the disclosure is not limited thereto.

Further, as shown in FIG. 6, the light emitting layer OL may include a first charge generation layer CGL11 and a second light emitting material layer EL12. The first charge generation layer CGL11 may be disposed on the first light emitting material layer EL11, and the second light emitting material layer EL12 may be disposed on the first charge generation layer CGL11.

The first charge generation layer CGL11 may inject a charge into each of the adjacent light emitting material layers EL11 and EL12, and may adjust a charge balance between the first light emitting material layer EL11 and the second light emitting material layer EL12. The first charge generation layer CGL11 may include an n-type charge generation layer and a p-type charge generation layer. The p-type charge generation layer may be disposed on the n-type charge generation layer.

The second light emitting material layer EL12 may emit light of the same color as the first light emitting material layer EL11. For example, the second light emitting material layer EL12 may emit blue light having the same peak wavelength as or a different peak wavelength from the first light emitting material layer EL11. However, the disclosure is not limited thereto, and the second light emitting material layer EL12 may emit light having a different color from the first light emitting material layer EL11. For example, the second light emitting material layer EL12 may emit green light, and the first light emitting material layer EL11 may emit blue light. According to an embodiment shown in FIG. 6, since the light emitting layer OL may include two light emitting material layers EL11 and EL12, light emission efficiency and lifetime may be improved compared to an embodiment shown in FIG. 5.

Further, as shown in FIG. 7, the light emitting layer OL may include a second charge generation layer CGL12 and a third light emitting material layer EL13. The second charge generation layer CGL12 may be disposed on the second light emitting material layer EL12 and the first electron transport layer ETL1, and the third light emitting material layer EL13 may be disposed on the second charge generation layer CGL12. The second charge generation layer CGL12 may be indirectly disposed on the first electron transport layer ETL1. For example, as illustrated in FIG. 7, the third light emitting material layer EL13 may be disposed between the first electron transport layer ETL1 and the second charge generation layer CGL12.

The third light emitting material layer EL13, the first light emitting material layer EL11, and the second light emitting material layer EL12 may all emit light of the same color. For example, the third light emitting material layer EL13, the first light emitting material layer EL11, and the second light emitting material layer EL12 may all emit blue light. However, the disclosure is not limited thereto. One of the third light emitting material layer EL13, the first light emitting material layer EL11, and the second light emitting material layer EL12 may emit green light, and the others thereof may emit blue light.

Meanwhile, although not shown in the drawing, the light emitting layer OL may have a structure in which four light emitting material layers may be arranged or disposed to overlap each other. All the four light emitting material layers may emit blue light. Further, at least one of the fourth light emitting material layers may emit green light, and the others thereof may emit blue light.

Referring to FIG. 4 again, a second electrode layer CE may be disposed on the light emitting layer OL. The second electrode layer CE may have semi-permeability or permeability. The second electrode layer CE may be a cathode electrode. In a case that the second electrode layer CE has semi-permeability, the second electrode layer CE may include Ag, Mg, Cu, Al, Pt, Pd, Au, Ni, Nd, Ir, Cr, Li, Ca, LiF/Ca, LiF/Al, Mo, Ti, or a compound or mixture thereof, for example, a mixture of Ag and Mg. In a case that the second electrode layer CE has permeability, the second electrode layer CE may include a transparent conductive oxide (TCO). For example, the second electrode layer CE may include tungsten oxide ($W_xO_x$), titanium oxide ($TiO_2$), indium tin oxide (ITO), indium zinc oxide (IZO), zinc oxide (ZnO), indium tin zinc oxide (ITZO), or magnesium oxide (MgO).

The first anode electrode AE1, the light emitting layer OL, and the second electrode layer CE may constitute a first light emitting element ED1, the second anode electrode AE2, the light emitting layer OL, and the second electrode layer CE may constitute a second light emitting element ED2, and the third anode electrode AE3, the light emitting layer OL, and the second electrode layer CE may constitute a third light emitting element ED3. Light L emitted from the first to third light emitting elements ED1, ED2, and ED3 may be provided to the second display substrate 30.

A thin film encapsulation layer 170 may be disposed on the second electrode layer CE. The thin film encapsulation layer 170 may be a common layer disposed over the plurality of light emission areas LA1, LA2, and LA3 and the non-light emission area LB. The thin film encapsulation layer 170 may directly cover or overlap the second electrode layer CE. The thin film encapsulating layer 170 may include a first encapsulating inorganic layer 171, an encapsulating organic layer 173, and a second encapsulating inorganic layer 175, which may be sequentially laminated on the second electrode layer CE.

Each of the first encapsulating inorganic layer 171 and the second encapsulating inorganic layer 175 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), or lithium fluoride.

The encapsulating organic layer 173 may be disposed between the first encapsulating inorganic layer 171 and the second encapsulating inorganic layer 175. The encapsulating organic layer 173 may include an organic material. For example, the encapsulating organic layer 173 may include an acrylic resin, a methacrylic resin, polyisoprene, a vinyl resin, an epoxy resin, a urethane resin, a cellulose resin, or a perylene resin.

However, the structure of the thin film encapsulation layer 170 is not limited to the above example, and the laminate structure of the thin encapsulation layer 170 may be variously changed.

A panel light blocking layer 190 may be disposed on the thin film encapsulation layer 170. The panel light blocking layer 190 may be disposed to overlap the non-light emission area LB. For example, the panel light blocking layer 190 may be disposed to overlap the pixel defining layer 150. The panel light blocking layer 190 may prevent the occurrence of color mixing due to the invasion of light between the adjacent light emission areas LA1, LA2, and LA3, thereby further improving a color reproduction rate. The panel light blocking layer 190 may include an organic light blocking material, and may be formed through a coating and exposure process of the organic light blocking material. In an embodiment, the panel light blocking layer 190 may be omitted.

The second display substrate 30 may be disposed on the first display substrate 10.

The second display substrate 30 may include a second substrate 310, a light blocking layer 390, a color filter layer 330, a partition wall 370, a light transmission pattern 341, wavelength conversion patterns 343 and 345, a first capping layer PS1, and a second capping layer PS2.

The second substrate 310 may be made of a light-transmitting material. The second substrate 310 may include a glass substrate or a plastic substrate. The second substrate 310 may include a separate layer, for example, an insulating layer such as an inorganic layer, on the glass substrate or the plastic substrate.

The light blocking layer 390 may be disposed on one or a surface of the second substrate 310 facing the first display substrate 10, for example, on the lower surface of the second substrate 310. The light blocking layer 390 may be disposed to overlap the light blocking area PB, and may be disposed along the boundary of each of the plurality of light transmission areas PA1, PA2, and PA3. The light blocking layer 390 may overlap the partition wall 370 to be described later in the thickness direction. The light blocking layer 390 may include an organic light blocking material, and may be formed through a coating and exposure process of the organic light blocking material. The light blocking layer 390 may absorb external light, thereby reducing color distortion due to a reflection of external light. Moreover, the light blocking layer 190 may prevent the occurrence of color mixing due to the invasion of light between the adjacent light transmission areas PA1, PA2, and PA3, thereby further improving a color reproduction rate.

The color filter layer 330 may be disposed on the second substrate 310 and the light blocking layer 390. The color filter layer 330 may include a first color filter 331, a second color filter 333, and a third color filter 335. The first color filter 331 may overlap the first effective pixel area AP1, the second color filter 333 may overlap the second effective pixel area AP2, and the third color filter 335 may overlap the third effective pixel area AP3. Further, the first color filter 331 may overlap the first light transmission area PA1, and the second color filter 333 may overlap the second light transmission area PA2, and the third color filter 335 may overlap the third light transmission area PA3. Parts of the first color filter 331, the second color filter 333, and the third color filter 335 may overlap the light blocking area PB.

Each of the first color filter 331, the second color filter 333, and the third color filter 335 may selectively transmit light of a specific or predetermined color, and may absorb light of other colors to block the light of other colors.

For example, the first color filter 331 may selectively transmit the light of the first color (for example, blue light), and may block or absorb the light of the second color (for example, red light) and the light of the third color (for example, green light). The first color filter 331 may be a blue color filter, and may include a blue colorant such as a blue dye or a blue pigment. In the specification, the colorant may be understood as including both a dye and a pigment.

The second color filter 333 may selectively transmit the light of the second color (for example, red light), and may block or absorb the light of the first color (for example, blue light) and the light of the third color (for example, green light). The second color filter 333 may be a red color filter, and may include a red colorant such as a red dye or a red pigment.

The third color filter 335 may selectively transmit the light of the third color (for example, green light), and may block or absorb the light of the first color (for example, blue light) and the light of the second color (for example, red light). The third color filter 335 may be a green color filter, and may include a green colorant such as a green dye or a green pigment.

The first capping layer PS1 may be disposed on the color filter layer 330. The first capping layer PS1 may prevent the damage or contamination of the color filter layer 330 due to the penetration of impurities such as moisture and air from the outside. Further, the first capping layer PS1 may prevent the colorants included in the color filter layer 330 from diffusing into another component. The first capping layer PS1 may be in direct contact with one or a surface of the color filter layer 330. The first capping layer PS1 may be made of an inorganic material. For example, the first capping layer PS1 may include silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

The partition wall 370 may be disposed on the first capping layer PS1. The partition wall 370 may be disposed to overlap the light blocking area PB, and may be disposed along the boundary of each of the light transmission areas PA1, PA2, and PA3. The partition wall 370 may define a space that exposes an area overlapping each of the light transmission areas PA1, PA2, and PA3 in the one or a surface of the first capping layer PS1. The light transmission pattern 341 and wavelength conversion patterns 343 and 345, which will be described later, may be disposed in the space defined by the partition wall 370, and the partition wall 370 may serve as a guide for stably placing an ink composition for forming the light transmission pattern 341 and the wavelength conversion patterns 343 and 345 at a desired position.

The partition wall 370 may be made of an organic material, or may be made of a photosensitive organic material. The photosensitive organic material may be a negative photosensitive material which may be cured at a site irradiated with light, but is not limited thereto. In an embodiment, the partition wall 370 may include a light blocking material. In this case, the partition wall 370 may be disposed to overlap the light blocking area PB to block light transmission and may prevent color mixing between the adjacent light transmission areas.

The light transmission pattern 341, the first wavelength conversion pattern 343, and the second wavelength conversion pattern 345 may be disposed on the first capping layer PS1.

The light transmission pattern 341, the first wavelength conversion pattern 343, and the second wavelength conversion pattern 345 may be disposed in the space defined by the partition wall 370. In an embodiment, the upper surface of the light transmission pattern 341, the upper surface of the first wavelength conversion pattern 343 and the upper surface of the second wavelength conversion pattern 345 may be in contact with the first capping layer PS1, and the or a side surface of the light transmission pattern 341, the or a side surface of the first wavelength conversion pattern 343 and the or a side surface of the second wavelength conversion pattern 345 may be in contact with the partition wall 370. In an embodiment, the light transmission pattern 341, the first wavelength conversion pattern 343, and the second wavelength conversion pattern 345 may be formed by an inkjet method using an ink composition. However, the disclosure is not limited thereto. In an embodiment, the light transmission pattern 341, the first wavelength conversion pattern 343, and the second wavelength conversion pattern 345 may be formed by applying a photosensitive material and exposing and developing the applied photosensitive material.

The light transmission pattern 341 may be disposed to overlap the first effective pixel area AP1 or the first light transmission area PA1. Further, the light transmission pattern 341 may not overlap the second effective pixel area AP2 and the third effective pixel area AP3.

The light L provided from the first light emission element ED1 may pass through the light transmission pattern 341 and be provided to the first color filter 331 to be described later. For example, the light provided to the first color filter 331 may be blue light, and may have the same wavelength as the light L emitted from the first light emission element ED1.

The light transmission pattern 341 may include a first base resin 341a and first scatterers 341b dispersed in the first base resin 341a.

The first base resin 341a may be made of an organic material having high light transmittance. Examples of the organic material may include an epoxy resin, an acrylic resin, a cardo resin, and an imide resin.

The first scatterers 341b may have a refractive index different from that of the first base resin 341a and form an optical interface with the first base resin 341a. For example, the first scatterers 341b may be light scattering particles. The first scatterers 341b are not particularly limited as long as they are materials that may scatter at least a part of transmitted light, but may be, for example, metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$). Examples of the material of the organic particles may include acrylic resins and urethane resins. The first scatterers 341b may scatter light in a random direction regardless of an incident direction of incident light without substantially converting a wavelength of light passing through the light transmission pattern 341. Thus, side visibility of light passing through the light transmission pattern 341 may be improved.

The first wavelength conversion pattern 343 may be disposed to overlap the second effective pixel area AP2 or the second light transmission area PA2, and may not overlap the first effective pixel area AP1 and the third effective pixel area AP3.

The first wavelength conversion pattern 343 may convert blue light, which may be light L provided from the first light emission element ED1, into red light having a wavelength ranging from about 610 nm to about 650 nm, and emit light. The light emitted from the first wavelength conversion pattern 343 may be provided to the second color filter 333. In an embodiment, the thickness of the first wavelength conversion pattern 343 may be in a range of about 3 μm to about 15 μm.

The first wavelength conversion pattern 343 may include a second base resin 343a and a first wavelength conversion material 343b dispersed in the second base resin 343a, and may include second scatterers 343c dispersed in the second base resin 343a.

The second base resin 343a is not particularly limited as long as it has a high light transmittance and excellent dispersion properties for the first wavelength conversion material 343b and the second scatterers 343c. For example, the second base resin 343a may be made of the same or similar material as the first base resin 341a, or may include at least one of the materials exemplified as constituent materials of the first base resin 341a.

The first wavelength conversion material 343b may convert the peak wavelength of incident light to another specific or predetermined peak wavelength. Examples of the first wavelength conversion material 343b may include quantum dots, quantum rods, and phosphors. For example, the quantum dots may be particulate matter that may emit a specific or predetermined color while electrons move from a conduction band to a valence band.

The quantum dot may be a semiconductor nanocrystalline material. The quantum dot may have a specific or predetermined band gap depending on its composition and size, and thus may absorb light and then emit light having an intrinsic wavelength. Examples of the semiconductor nanocrystals of the quantum dots may include group IV nanocrystals, group II-VI compound nanocrystals, group III-V compound nanocrystals, group IV-VI nanocrystals, and combinations thereof.

Example of the group IV nanocrystals may include, but are not limited to, silicon (Si), germanium (Ge), and two-element compounds such as silicon carbide (SiC) and silicon-germanium (SiGe).

Example of the group II-VI compound nanocrystals may include, but are not limited to, two-element compounds such as CdSe, CdTe, ZnS, ZnSe, ZnTe, ZnO, HgS, HgSe, HgTe, MgSe, MgS, and mixtures thereof; three-element compounds such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and four-component compounds such as HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

Example of the group III-V compound nanocrystals may include, but are not limited to, two-element compounds such as GaN, GaP, GaAs, GaSb, AlN, AlP, AlAs, AlSb, InN, InP, InAs, InSb, and mixtures thereof; three-element compounds such as GaNP, GaNAs, GaNSb, GaPAs, GaPSb, AlNP, AlNAs, AlNSb, AlPAs, AlPSb, InNP, InNAs, InNSb, InPAs, InGaP, InPSb, GaAlNP, and mixtures thereof; and four-component compounds such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

Example of the group IV-VI nanocrystals may include, but are not limited to, two-element compounds such as SnS, SnSe, SnTe, PbS, PbSe, PbTe, and mixtures thereof; three-element compounds such as SnSeS, SnSeTe, SnSTe, PbSeS, PbSeTe, PbSTe, SnPbS, SnPbSe, SnPbTe, and mixtures thereof; and four-component compounds such as SnPbSSe, SnPbSeTe, SnPbSTe, and mixtures thereof.

The quantum dot may have a core-shell structure including a core including the aforementioned nanocrystals and a shell surrounding the core. The shell of the quantum dot may prevent the chemical denaturation of the core to serve as a protective layer for maintaining semiconductor characteristics and/or a charging layer for imparting electrophoretic characteristics to the quantum dot. The shell may be a single layer or a multi-layer. Examples of the shell of the quantum dot may include oxides of metals or nonmetals, semiconductor compounds, and combinations thereof.

Examples of the oxides of metals or nonmetals may include, but are not limited to, two-element compounds such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO; and three-element compounds such as $MgAl_2O_4$, $CoFe_2O_4$, $NiFe_2O_4$, and $CoMn_2O_4$.

Examples of the semiconductor compounds may include, but are not limited to, CdS, CdSe, CdTe, ZnS, ZnSe, ZnTe, ZnSeS, ZnTeS, GaAs, GaP, GaSb, HgS, HgSe, HgTe, InAs, InP, InSb, AlAs, AlP, and AlSb.

The light emitted by the first wavelength conversion material 343b may have a light emission wavelength spectrum half band width of about 45 nm or less, or about 40 nm or less, or about 30 nm or less, and thus the color purity and color reproducibility of the color displayed by the display device 1 may be further improved. Further, the light emitted by the first wavelength conversion material 343b may be emitted toward various directions regardless of the incident direction of incident light. Thus, the side visibility of a display device may be improved.

A part of the light L provided from the second light emitting element ED2 may be transmitted and emitted through the first wavelength conversion pattern 343 without being converted into red light by the first wavelength conversion material 343b. The component of the light L incident on the second color filter 333 without being converted by the first wavelength conversion pattern 343 may be blocked by the second color filter 333. On the other hand, the red light converted by the first wavelength conversion pattern 343 may be transmitted through the second color filter 333 and emitted to the outside. Accordingly, the second light L2 emitted from the first light transmission area PA2 to the outside of the display device 1 may be red light.

The second scatterers 343c may have a refractive index different from that of the second base resin 343a and form an optical interface with the second base resin 343a. For example, the second scatterers 343c may be light scattering particles. The second scatterers 343c are not particularly limited as long as they are materials that may scatter at least a part of transmitted light, but may be, for example, metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$). Examples of the material of the organic particles may include acrylic resins and urethane resins. The second scatterers 343c may scatter light in a random direction regardless of an incident direction of incident light without substantially converting a wavelength of light passing through the first wavelength conversion pattern 343. Thus, the length of a path of light passing through the first wavelength conversion pattern 343 may be increased, and the color conversion efficiency by the second wavelength conversion material 343a may be increased.

The second wavelength conversion pattern 345 may overlap the third effective pixel area AP3 or the third light transmission area PA3, and may not overlap the first effective pixel area AP1 and the second effective pixel area AP2.

The second wavelength conversion pattern 345 may convert blue light into green light having a wavelength ranging from about 510 nm to about 550 nm and emit the green light.

The second wavelength conversion pattern 345 may include a third base resin 345a and a second wavelength conversion material 345b dispersed in the third base resin 345a, and may include third scatterers 345c dispersed in the third base resin 345a.

The third base resin 345a is not particularly limited as long as it has a high light transmittance and excellent dispersion properties for the second wavelength conversion material 345b and the third scatterers 345c. For example, the third base resin 345a may include an organic material such as an epoxy resin, an acrylic resin, a cardo resin, or an imide resin.

The second wavelength conversion material 345b may convert the peak wavelength of incident light to another specific or predetermined peak wavelength. The second wavelength conversion material 345b may convert blue light having a peak wavelength ranging from about 430 nm to about 470 nm into green light having a peak wavelength ranging from about 510 nm to about 550 nm.

Examples of the second wavelength conversion material 345b may include quantum dots, quantum rods, and phosphors. In a case that both the second wavelength conversion material 345b and the first wavelength conversion material 343b may be made of quantum dots, the diameter of each of the quantum dots forming the first wavelength conversion material 343b may be larger than the diameter of each of the quantum dots forming the second wavelength conversion material 345b. For example, the quantum dot diameter of the first wavelength conversion material 343b may be in a range of about 55 Å to about 65 Å. Further, the quantum dot diameter of the second wavelength conversion material 345b may be in a range of about 40 Å to about 50 Å.

A part of the light L provided from the third light emitting element ED3 may be transmitted and emitted through the second wavelength conversion pattern 345 without being converted into green light by the second wavelength conversion material 345b. The component of the light L incident on the third color filter 335 without being converted by the second wavelength conversion pattern 345 may be blocked by the third color filter 335. On the other hand, the green light converted by the second wavelength conversion pattern 345 may be transmitted through the third color filter 335 and emitted to the outside. Accordingly, the third light L3 emitted from the third light transmission area PA3 to the outside may be green light. Besides, since a detailed description of the second wavelength conversion material 345b may be substantially the same as or similar to the detailed description of the first wavelength conversion material 343b described above, redundant contents may be omitted.

The third scatterers 345c may have a refractive index different from that of the third base resin 345a and form an optical interface with the third base resin 345a. For example, the third scatterers 345c may be light scattering particles. Besides, since a detailed description of the third scatterers 345c may be substantially the same as or similar to the description of the second scatterers 343c described above, redundant contents may be omitted.

A portion of the first capping layer PS1 overlapping the light transmission pattern 341, a portion of the first capping layer PS1 overlapping the first wavelength conversion pattern 343, and a portion of the first capping layer PS1 overlapping the second wavelength conversion pattern 345 may not be in direct contact with the second substrate 310. A portion of the first capping layer PS1 overlapping the light transmission pattern 341, a portion of the first capping layer PS1 overlapping the first wavelength conversion pattern 343, and a portion of the first capping layer PS1 overlapping the second wavelength conversion pattern 345 may be spaced apart from the second substrate 310 with the color filter layer 330 interposed therebetween.

The second capping layer PS2 may be disposed on the light transmission pattern 341, the first wavelength conversion pattern 343, and the second wavelength conversion pattern 345. The second capping layer PS2 may cover or overlap the light transmission pattern 341, the first wavelength conversion pattern 343, the second wavelength conversion pattern 345, and the partition wall 370. The second capping layer PS2 may seal the light transmission pattern 341, the first wavelength conversion pattern 343, and the second wavelength conversion pattern 345 together with the first capping layer PS1. Accordingly, it may be possible to prevent the light transmission pattern 341, the first wavelength conversion pattern 343 and the second wavelength conversion pattern 345 from being damaged or contaminated by the penetration of impurities such as moisture or air from the outside.

In an embodiment, the second capping layer PS2 may be made of an inorganic material. The second capping layer PS2 may be made of the same or similar material as the first capping layer PS1 or may include at least one of the materials exemplified as constituent materials of the first capping layer PS1.

A filling layer 70 may be disposed between the second capping layer PS2 of the second display substrate 30 and the thin film encapsulation layer 170 of the first display substrate 10. The filling layer 70 may be in direct contact with the second capping layer PS2.

Hereinafter, the first test pixel area TP1 will be described in detail.

Figure 8:
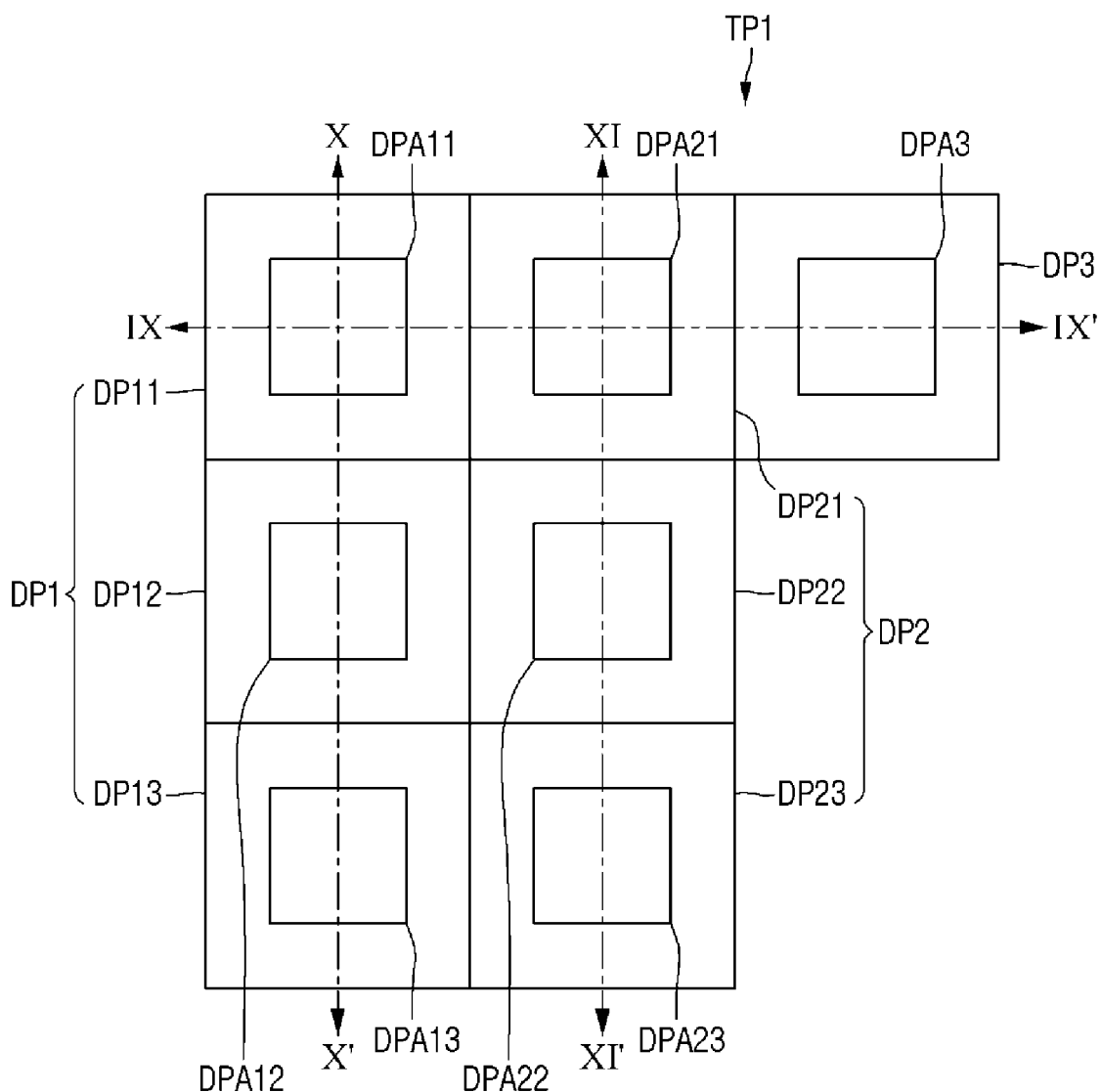
FIG. 8 is an enlarged plan view of the first test pixel area in FIG. 2.
Figure 9:
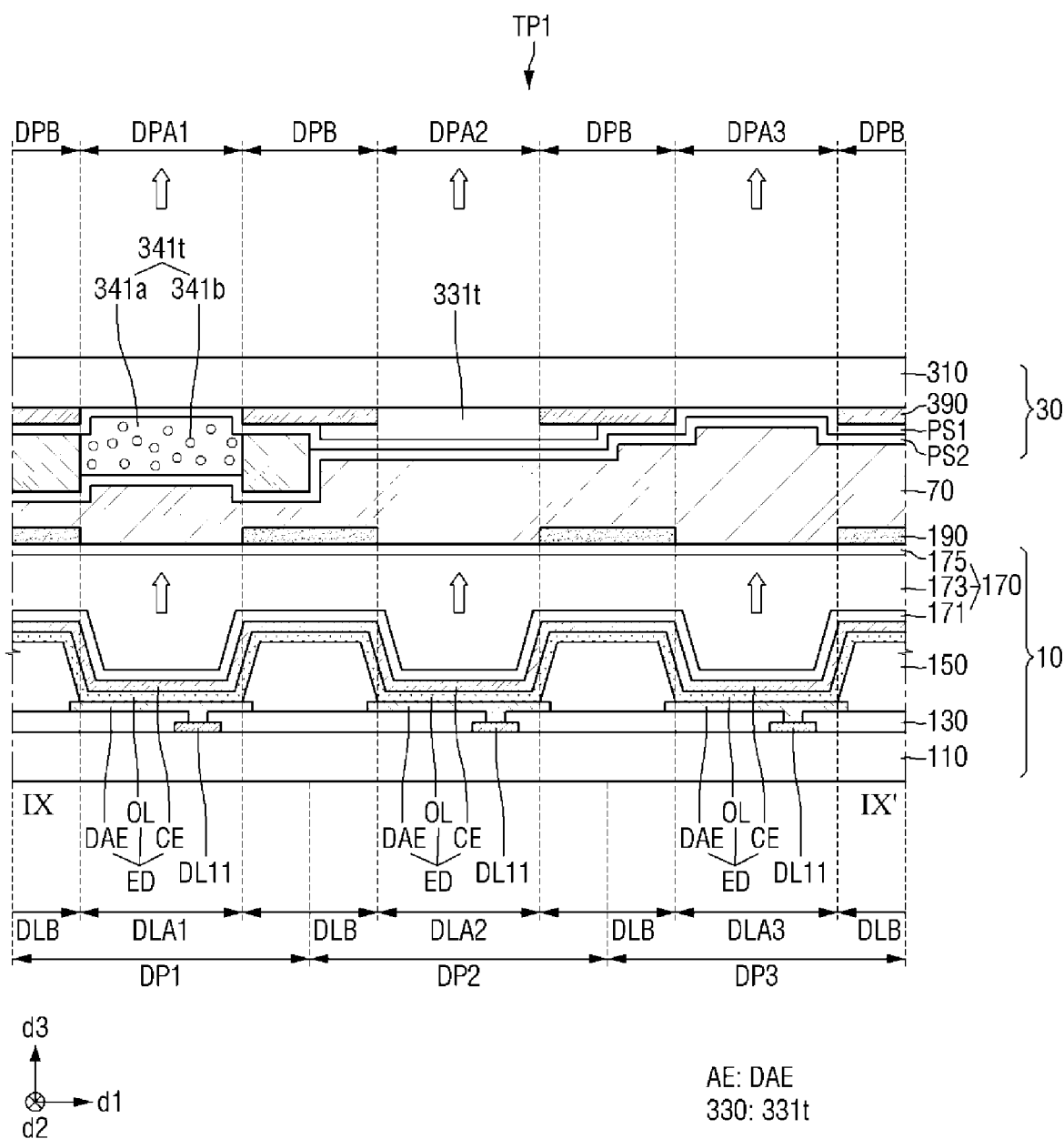
FIG. 9 is a schematic cross-sectional view taken along the line IX-IX' in FIG. 8.
Figure 10:
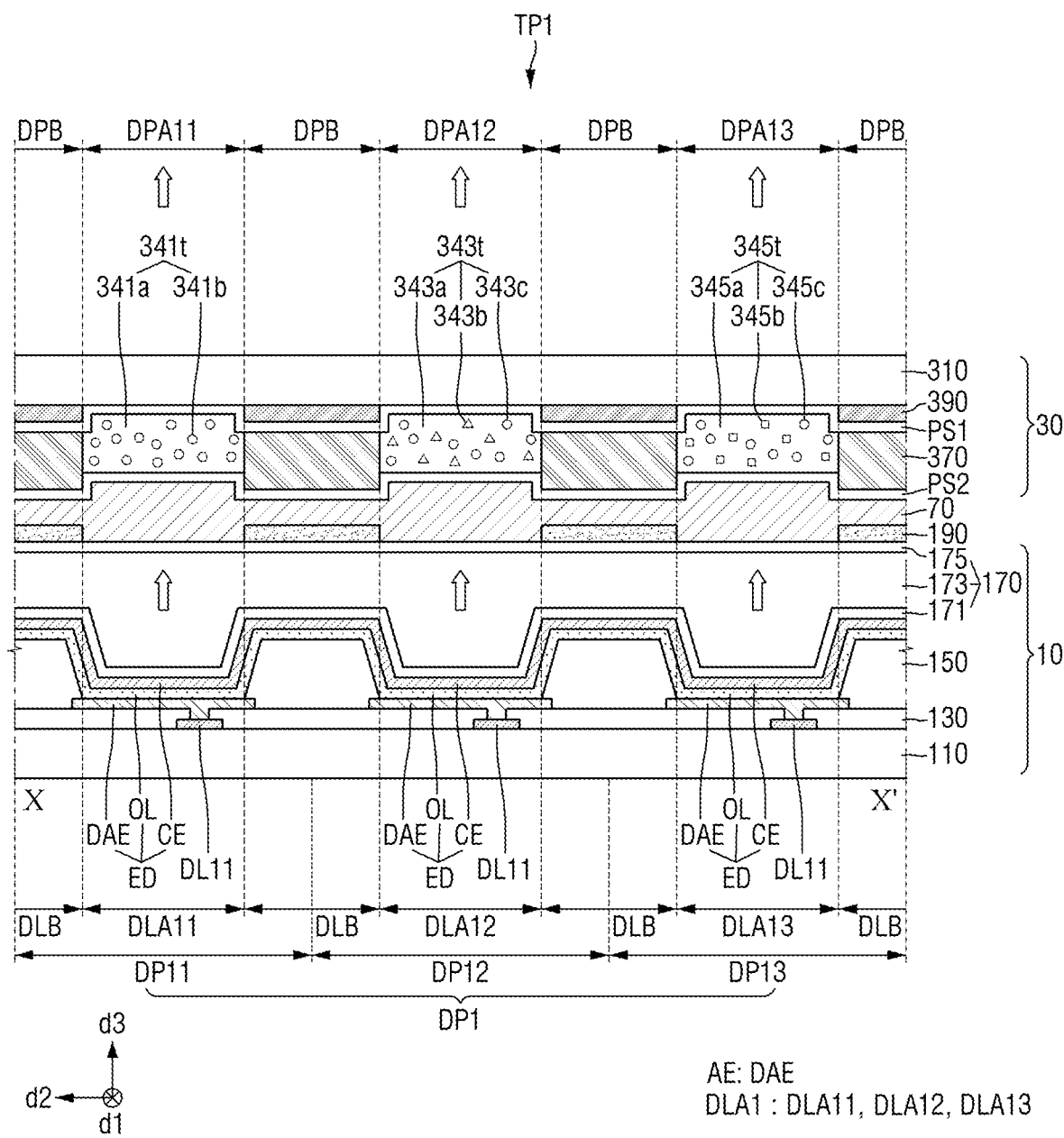
FIG. 10 is a schematic cross-sectional view taken along the line X-X' in FIG. 8.
Figure 11:
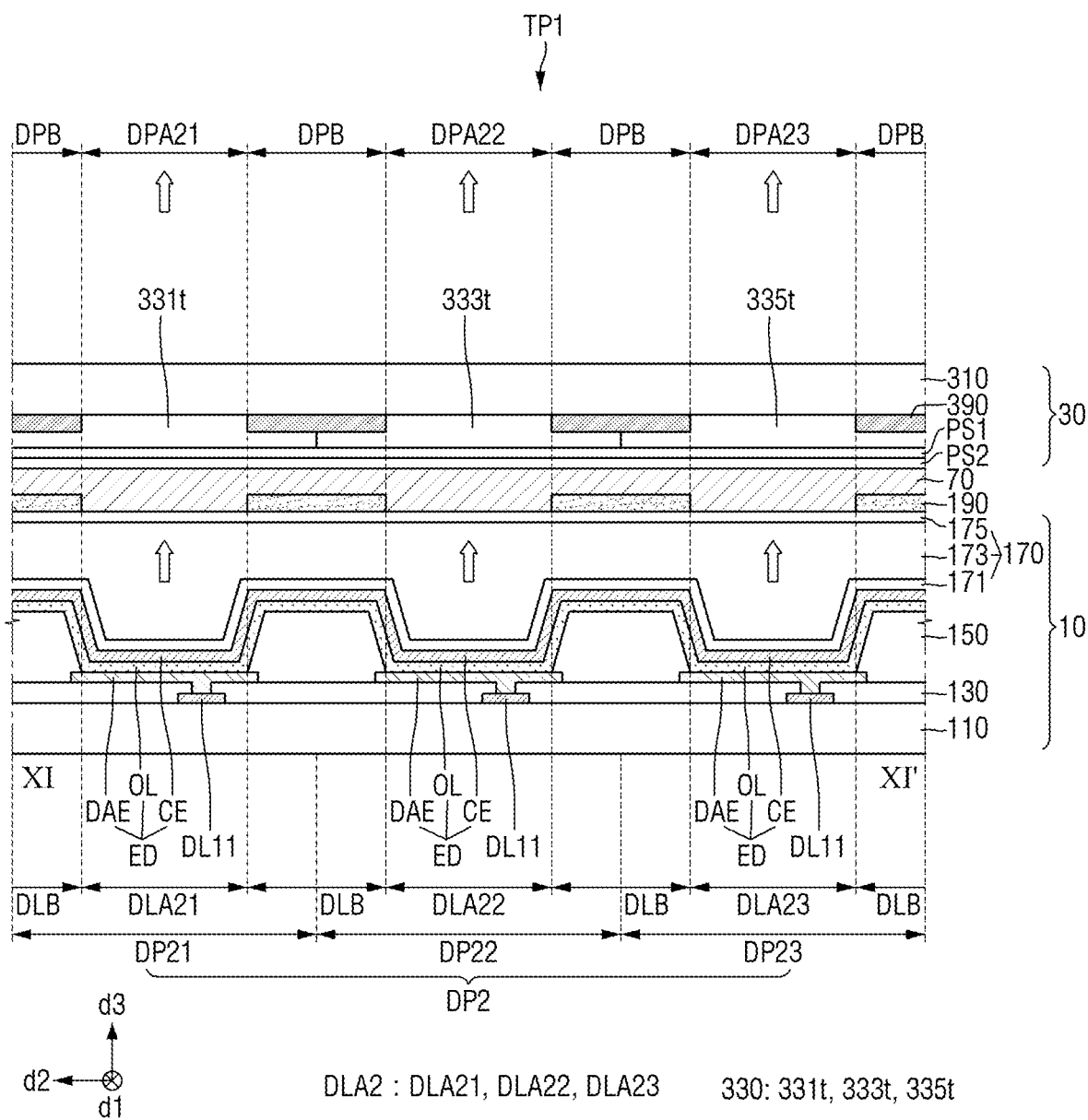
FIG. 11 is a schematic cross-sectional view taken along the line XI-XI' in FIG. 8.

FIG. 8 is an enlarged plan view of the first test pixel area in FIG. 2, FIG. 9 is a schematic cross-sectional view taken along the line IX-IX' in FIG. 8, FIG. 10 is a schematic cross-sectional view taken along the line X-X' in FIG. 8, and FIG. 11 is a schematic cross-sectional view taken along the line XI-XI' in FIG. 8.

Referring to FIGS. 8 to 11, the first test pixel area TP1 may include a first dummy pixel area DP1, a second dummy pixel area DP2, and a third dummy pixel area DP3. In an embodiment, the first dummy pixel area DP1, the second dummy pixel area DP2, and the third dummy pixel area DP3 may be arranged or disposed along one or a direction. For example, the first dummy pixel area DP1, the second dummy pixel area DP2, and the third dummy pixel area DP3 may be sequentially arranged or disposed along the first direction d1. However, the arrangement order and direction of the dummy pixel areas are not limited to FIG. 8. The first dummy pixel area DP1, the second dummy pixel area DP2, and the third dummy pixel area DP3 may be arranged or disposed along the second direction d2, or may be arranged or disposed in various forms.

The first dummy pixel area DP1, the second dummy pixel area DP2, and the third dummy pixel area DP3 may be arranged on the first display substrate 10.

In an embodiment, the first dummy pixel area DP1 may include a first dummy light emission area DLA1 and a dummy light blocking area DPB surrounding the first dummy light emission area DLA1, the second dummy pixel area DP2 may include a second dummy light emission area DLA2 and a dummy light blocking area DPB surrounding the second dummy light emission area DLA2, and the third dummy pixel area DP3 may include a third dummy light emission area DLA3 and a dummy light blocking area DPB surrounding the third dummy light emission area DLA3. The first dummy light emission area DLA1, the second dummy light emission area DLA2, and the third dummy light emission area DLA3 may be areas where light may be emitted from the non-display area NDA by a light emitting layer in a case that inspecting the efficiency of a display device. The dummy non-light emission area DLB may be an area in which the light emitting layer may not emit light. The dummy non-light emission area DLB may be an area in which the direct light emission by the light emitting layer may not be performed in the non-display area NDA.

In an embodiment, the first dummy light emission area DLA1, the second dummy light emission area DLA2, and the third dummy light emission area DLA3 may be surrounded by the dummy non-light emission area DLB. In an embodiment, the first dummy light emission area DLA1, the second dummy light emission area DLA2, the third dummy light emission area DLA3, and the dummy non-light emission area DLB may be divided by the pixel defining layer 150.

In the non-display area NDA, a first dummy light transmission area DPA1, a second dummy light transmission area DPA2, a third dummy light transmission area DPA3, and a dummy light blocking area DPB may be defined on the second display substrate 30.

The first dummy light transmission area DPA1, the second dummy light transmission area DPA2, and the third dummy light transmission area DPA3 may be areas where the light emitted from the first display substrate 10 may pass through the second display substrate 30 and may be emitted and directed to the outside of the display device 1 in a case that inspecting the efficiency of a display device. The dummy light blocking area DPB may be an area where the light emitted from the first display substrate 10 may not be transmitted.

In an embodiment, the first dummy light transmission area DPA1, the second dummy light transmission area DPA2, the third dummy light transmission area DPA3, and the dummy light blocking area DPB may be defined by the above-described light blocking layer 390.

An area surrounding the first dummy light transmission area DPA1 of the first dummy light transmission area DPA1 and the dummy light blocking area DPB may overlap the first dummy pixel area DP1. In an embodiment, the first dummy light transmission area DPA1 may overlap the first dummy light emission area DLA1. An area surrounding the second dummy light transmission area DPA2 of the second dummy light transmission area DPA2 and the dummy light blocking area DPB may overlap the second dummy pixel area DP2. In an embodiment, the second dummy light transmission area DPA2 may overlap the second dummy light emission area DLA2. An area surrounding the third dummy light transmission area DPA3 of the third dummy light transmission area DPA3 and the dummy light blocking area DPB may overlap the third dummy pixel area DP3. In an embodiment, the third dummy light transmission area DPA3 may overlap the third dummy light emission area DLA3. The dummy light blocking area DPB may overlap the dummy non-light emission area DLB.

The first dummy pixel area DP1, the second dummy pixel area DP2, and the third dummy pixel area DP3 may be inspection areas for inspecting the characteristics of components overlapping the effective pixel area AP, respectively. For example, the first dummy pixel area DP1, the second dummy pixel area DP2, and the third dummy pixel area DP3 may be inspection areas for inspecting the characteristics of the light transmission pattern 341, the first wavelength conversion pattern 343, the second wavelength conversion pattern 345, the first color filter 331, the second color filter 333, the third color filter 335, the first light emitting element ED1, the second light emitting element ED2, and the third light emitting element ED3. Hereinafter, a case where the first dummy pixel area DP1 may be an area for inspecting the characteristics of the light transmission pattern 341, the first wavelength conversion pattern 343, and the second wavelength conversion pattern 345 arranged or disposed in the effective pixel area AP, the second dummy pixel area DP2 may be an area for inspecting the characteristics of the first color filter 331, the second color filter 333, and the third color filter 335 arranged or disposed in the effective pixel area AP, and the third dummy pixel area DP3 may be an area for inspecting the characteristics of the first light emitting element ED1, the second light emitting element ED2, and the third light emitting element ED3 arranged or disposed in the effective pixel area AP will be described as an example.

In a case that the light transmission characteristics of the light transmission pattern 341, the light transmission characteristics and light conversion efficiency of the first wavelength conversion pattern 343, and the light transmission characteristics and light conversion efficiency of the second wavelength conversion pattern 345 may be measured by the first dummy pixel area DP1, test light transmission patterns and test wavelength conversion patterns overlapping the first dummy pixel area DP1 may be disposed in the non-display area NDA. However, different from the effective pixel area AP, a color filter overlapping the test light transmission pattern and the test wavelength conversion patterns may not be provided or disposed in the first dummy pixel area DP1.

In a case that the transmittance of each of the first color filter 331, the second color filter 333, and the third color filter 335 for each wavelength band is measured by the second dummy pixel area DP2, test color filters overlapping the second dummy pixel area DP2 may be arranged or disposed in the non-display area NDA. However, different from the effective pixel area AP, a light transmission pattern or a wavelength conversion pattern overlapping the test color filter may not be provided.

In a case that the light emission efficiency of the test light emitting element ED may be measured by the third dummy pixel area DP3, the test light transmission pattern, the test wavelength conversion patterns, the test color filter, and the like may not be arranged or disposed in the third dummy pixel area DP3. For example, the third dummy pixel area DP3 may be a reference area for acquiring a reference value that may be a reference in the inspection of characteristics of the first dummy pixel area DP1 and the second dummy pixel area DP2.

In a state in which the first display substrate 10 and the second display substrate 30 are attached to each other, it may be difficult to inspect the characteristics of each of the light transmission patterns 341, the wavelength conversion patterns 343 and 345, the color filter layers 330, and the light emitting elements ED1, ED2 and ED3 in the display area DA. By way of example, in the display area DA, the light transmission pattern 341 and the wavelength conversion patterns 343 and 345 may overlap the color filter layer 330, and the light emitting elements ED1, ED2, and ED3 may overlap the light transmission pattern 341, the wavelength conversion patterns 343, 345, and the color filter layer 330. Therefore, in a state in which the respective components overlap each other, even if the light emitted to the outside is acquired, it may be difficult to monitor which component has an effect on the characteristics of emitted light or which component deteriorates the efficiency of the display device.

In the display device 1 according to an embodiment, since the first test pixel area TP1 may include first to third dummy pixel areas DP1, DP2, and DP3, the characteristics of each of the light transmission patterns 341, the wavelength conversion patterns 343 and 345, the color filter layers 330, and the light emitting elements ED1, ED2 and ED3 in the display area DA may be inspected even in a state in which the first display substrate 10 and the second display substrate 30 are attached to each other. Therefore, it may be possible to easily monitor the reduction in efficiency of the display device 1 that may occur after the first display substrate 10 and the second display substrate 30 may be attached to each other.

Hereinafter, a cross-sectional structure of the display device 1 in the first test pixel area TP1 will be described in detail. Some or a predetermined number of the components of the display device 1 in the first test pixel area TP1 may be substantially the same as or similar to those of the display device 1 in the effective pixel area AP described with reference to FIGS. 3 and 4. Therefore, redundant contents may be omitted, and differences will be mainly described.

A plurality of first dummy lines DL1, an insulating layer 130, a pixel defining layer 150, and a plurality of test light emitting elements ED may be arranged or disposed on the first substrate 110 in the first test pixel area TP1.

A first inspection line DL11 may be disposed on the first substrate 110. In an embodiment, a plurality of first inspection lines DL11 may be provided, and may include the same or similar material as the gate lines overlapping the above-described effective pixel area AP. The first inspection line DL11 may be disposed on the same layer as the gate line. The first inspection line DL11 may include at least one selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The insulating layer 130 may be disposed on the plurality of first inspection lines DL11. A first electrode layer AE may be disposed on the insulating layer 130. The first electrode layer AE may include a plurality of dummy anode electrodes DAE arranged or disposed in the first to third dummy pixel areas DP1, DP2, and DP3. The plurality of dummy anode electrodes DAE may be arranged or disposed to overlap the first dummy light emission area DLA1, the second dummy light emission area DLA2, and the third dummy light emission area DLA3, but at least some or a predetermined number of the plurality of dummy anode electrodes DAE may extend to the dummy non-light emission area DLB.

The plurality of dummy anode electrodes DAE may be electrically connected to the plurality of first inspection lines DL11 through via holes penetrating the insulating layer 130. Besides, since more detailed description of the first electrode layer AE may be the same as that described above with reference to FIGS. 3 and 4, redundant contents may be omitted.

The pixel defining layer 150 may be disposed on the first electrode layer AE. The pixel defining layer 150 may be disposed to overlap the boundary of each of the first to third dummy pixel areas DP1, DP2, and DP3. The pixel defining layer 150 may include an opening partially exposing the plurality of dummy anode electrodes DAE.

A light emitting layer OL may be disposed on the plurality of dummy anode electrodes DAE exposed by the opening of the pixel defining layer 150. The light emitting layer OL may have a shape of a continuous film formed or disposed over the first dummy light emission area DLA1, the second dummy light emission area DLA2, the third dummy light emission area DLA3, and the dummy non-light emission area DLB.

The second electrode layer CE may be disposed on the light emitting layer OL. The second electrode layer CE may be a cathode electrode as described above. Besides, since more detailed description of the second electrode layer CE has been described with reference to FIGS. 3 and 4, redundant contents may be omitted.

Although not shown in the drawing, a second inspection line (DL12 in FIG. 2) may be disposed on the first substrate 110. In an embodiment, the second inspection line DL12 may include the same or similar material as the data line disposed to overlap the above-described effective pixel area AP and may be made of the same layer as the data line. Alternatively, the second inspection line DL12 may include the same or similar material as the gate line and may be made of the same layer as the gate line. In an embodiment, the second inspection line DL12 may be located or disposed between the insulating layer 130 and the first substrate 110, and may be electrically connected to the second electrode layer CE.

The plurality of dummy anode electrodes DAE may form a plurality of test light emitting elements ED together with the light emitting layer OL and the second electrode layer CE. The plurality of test light emitting elements ED may be substantially the same as the first to third light emitting elements ED1, ED2, and ED3 described with reference to FIGS. 3 and 4. Accordingly, the characteristics of the plurality of test light emitting elements ED arranged or disposed to overlap the first test pixel area TP1 may be inspected to easily monitor the light emission efficiency of the first to third light emitting elements ED1, ED2, and ED3 overlapping the effective pixel area AP.

A thin film encapsulation layer 170 may be disposed on the second electrode layer CE. The thin film encapsulation layer 170 may be a common layer disposed over one or a surface of the second electrode layer CE. The thin film encapsulation layer 170 may directly cover or overlap the second electrode layer CE.

A panel light blocking layer 190 may be disposed on the thin film encapsulation layer 170. The panel light blocking layer 190 may be disposed to overlap the non-light emission areas DLB of the first to third dummy pixel areas DP1, DP2, and DP3. As described above, the panel light blocking layer 190 may be omitted.

A second display substrate 30 overlapping the first test pixel area TP1 may be disposed on the first display substrate 10. The second display substrate 30 may include a second substrate 310, a light blocking layer 390, a color filter layer 330, a partition wall 370, a test light transmission pattern 341*t*, a first test wavelength conversion pattern 343*t*, a second test wavelength conversion pattern 345*t*, a first capping layer PS1, and a second capping layer PS2, which may overlap the first test pixel area TP1.

As described above, the first dummy pixel area DP1 may be an area for inspecting the characteristics of the light transmission pattern 341, the first wavelength conversion pattern 343, and the second wavelength conversion pattern 345, which may overlap the effective pixel area AP, the second dummy pixel area DP2 may be an area for inspecting the characteristics of the first color filter 331, the second color filter 333, and the third color filter, which may overlap the effective pixel area AP, and the third dummy pixel area DP3 may be an area for inspecting the characteristics of the first to third light emitting elements ED1, ED2, and ED3, which may overlap the effective pixel area AP. A portion overlapping the first dummy pixel area DP1 of the second display substrate 30 will be described in more detail with reference to FIG. 10.

Further, referring to FIG. 10, the light blocking layer 390 and the first capping layer PS1 may be disposed on one or a surface of the second substrate 310 overlapping the first dummy pixel area DP1, the partition wall 370 including an opening may be disposed on the first capping layer PS1, and the test light transmission pattern 341*t*, the first test wavelength conversion pattern 343*t*, and the second test wavelength conversion pattern 345*t* may be disposed in the opening of the partition wall 370.

The test light transmission pattern 341*t* may include substantially the same or similar material as the light transmission pattern (341 in FIG. 4). For example, like the light transmission pattern (341 in FIG. 4), the test light transmission pattern 341*t* may include a first base resin 341*a* and first scatterers 341*b* dispersed in the first base resin 341*a*.

The first test wavelength conversion pattern 343*t* may include substantially the same or similar material as the first wavelength conversion pattern (343 in FIG. 4). For example, like the first wavelength conversion pattern (343 in FIG. 4), the first test wavelength conversion pattern 343*t* may include a second base resin 343*a*, and a first wavelength conversion material 343*b* and second scatterers 343*c* dispersed in the second base resin 343*a*.

The second test wavelength conversion pattern 345*t* may include substantially the same or similar material as the second wavelength conversion pattern (345 in FIG. 4). For example, like the second wavelength conversion pattern (345 in FIG. 4), the second test wavelength conversion pattern 345*t* may include a third base resin 345*a*, and a second wavelength conversion material 345*b* and third scatterers 345*c* dispersed in the third base resin 345*a*.

A portion of the first capping layer PS1 overlapping the first dummy pixel area DP1 may cover or overlap the light blocking layer 390, and a part of the first capping layer PS1 may be in direct contact with one or a surface of the second substrate 310. For example, a portion overlapping the test light transmission pattern 341*t*, the first test wavelength conversion pattern 343*t*, and the second test wavelength conversion pattern 345*t* may be in direct contact with the second substrate 310.

A second capping layer PS2 may be disposed on the test light transmission pattern 341*t*, the first test wavelength conversion pattern 343*t*, and the second test wavelength conversion pattern 345t. The second capping layer PS2 may cover or overlap the partition wall 370, the test light transmission pattern 341t, the first test wavelength conversion pattern 343t, and the second test wavelength conversion pattern 345t.

The test light transmission pattern 341t, the first test wavelength conversion pattern 343t, and the second test wavelength conversion pattern 345t may be disposed between a portion of the second capping layer PS2 overlapping the first dummy pixel area DP1 and a portion of the first capping layer PS1 overlapping the first dummy pixel area DP1. Therefore, the first capping layer PS1 and the second capping layer PS2 may be spaced apart from each other in an area overlapping the first dummy pixel area DP1 without being in contact with each other.

The first dummy pixel area DP1 may include a plurality of sub-dummy pixel areas. For example, the first dummy pixel area DP1 may include a first sub-dummy pixel area DP11, a second sub-dummy pixel area DP12, and a third sub-dummy pixel area DP13. In an embodiment, the first sub-dummy pixel area DP11, the second sub-dummy pixel area DP12, and the third sub-dummy pixel area DP13 may be sequentially arranged or disposed along a direction parallel to the second direction d2.

The first dummy light emission area DLA1 may include a first sub-dummy light emission area DLA11, a second sub-dummy light emission area DLA12, and a third sub-dummy light emission area DLA13.

The first sub-dummy pixel area DP11 may include a first sub-dummy light emission area DLA11 and a dummy non-light emission area DLB around the first sub-dummy light emission area DLA11, the second sub-dummy pixel area DP12 may include a second sub-dummy light emission area DLA12 and a dummy non-light emission area DLB around the second sub-dummy light emission area DLA12, and the third sub-dummy pixel area DP13 may include a third sub-dummy light emission area DLA13 and a dummy non-light emission area DLB around the third sub-dummy light emission area DLA13. Moreover, the first dummy light transmission area DPA1 disposed on the second display substrate 30 may include a first sub-dummy light transmission area DPA11 overlapping the first sub-dummy light emission area DLA11, a second sub-dummy light transmission area DPA12 overlapping the second sub-dummy light emission area DLA12, and a third sub-dummy light transmission area DPA13 overlapping the third sub-dummy light emission area DLA13.

The partition wall 370 may be disposed to overlap the dummy non-light emission area DLB or the dummy light blocking area DPB, and may include an opening exposing the first sub-dummy light transmission area DPA11, the second sub-dummy light transmission area DPA12, and the third sub-dummy light transmission area DPA13.

The test light transmission pattern 341t, the first test wavelength conversion pattern 343t, and the second test wavelength conversion pattern 345t may be disposed to overlap the first test pixel area TP1, and may be located or disposed in the opening of the partition wall 370.

The test light transmission pattern 341t may be disposed to overlap the first sub-dummy light transmission area DPA11. In an embodiment, the test light transmission pattern 341t may not overlap the second sub-dummy transmission area DPA12 and the third sub-dummy transmission area DPA13. In other words, the test light transmission pattern 341t overlapping the second sub-dummy light transmission area DPA12 and the third sub-dummy light transmission area DPA13 may not be provided.

The first test wavelength conversion pattern 343t may be disposed to overlap the second sub-dummy light transmission area DPA12. In an embodiment, the first wavelength conversion pattern 343 may not overlap the first sub-dummy transmission area DPA11 and the third sub-dummy transmission area DPA13. In other words, the first test wavelength conversion pattern 343t overlapping the first sub-dummy transmission area DPA11 and the third sub-dummy transmission area DPA13 may not be provided.

The second test wavelength conversion pattern 345t may be disposed to overlap the third sub-dummy light transmission area DPA13. In an embodiment, the second test wavelength conversion pattern 345t may not overlap the first sub-dummy light transmission area DPA11 and the second sub-dummy light transmission area DPA12. In other words, the second test wavelength conversion pattern 345t overlapping the first sub-dummy light transmission area DPA11 and the second sub-dummy light transmission area DPA12 may not be provided.

As described above, in a case that the test light transmission pattern 341t, the first test wavelength conversion pattern 343t, and the second test wavelength conversion pattern 345t may be arranged or disposed in the first sub-dummy transmission area DPA11, the second sub-dummy transmission area DPA12, and the third sub-dummy transmission area DPA13, respectively, the light transmittance or light conversion of the test light transmission pattern 341t, the first test wavelength conversion pattern 343t, and the second test wavelength conversion pattern 345t may be precisely measured in a state in which the first display substrate 10 and the second display substrate 20 may be attached to each other. The light transmittance or light conversion of the test light transmission pattern 341t, the first test wavelength conversion pattern 343t, and the second test wavelength conversion pattern 345t may be substantially the same as light transmittance or light conversion of the light transmission pattern (341 in FIG. 4), the first wavelength conversion pattern (343 in FIG. 4), and the second wavelength conversion pattern (345 in FIG. 4), which may overlap the effective pixel area AP. Accordingly, the reduction in efficiency of the display device 1 caused by the light transmission pattern (341 in FIG. 4), the first wavelength conversion pattern (343 in FIG. 4), and the second wavelength conversion pattern (345 in FIG. 4) in the effective pixel area AP may be indirectly monitored by inspecting or analyzing the light emitted from the first sub-dummy transmission area DPA11, the second sub-dummy transmission area DPA12, and the third sub-dummy transmission area DPA13 after attaching the first display substrate 10 to the second display substrate 30.

Since detailed descriptions of the test light transmission pattern 341t, the first test wavelength conversion pattern 343t, and the second test wavelength conversion pattern 345t may be the same as the descriptions of the light transmission pattern (341 in FIG. 4), the first wavelength conversion pattern (343 in FIG. 4), and the second wavelength conversion pattern (345 in FIG. 4) having been described with reference to FIGS. 3 and 4, redundant contents may be omitted.

Referring to FIG. 9 again, the second dummy pixel area DP2 may be an inspection area for measuring the transmittance of the first to third color filters (331, 333, and 335 in FIG. 4) overlapping the effective pixel area AP. In this case, the test light transmission pattern 341t, the first test wavelength conversion pattern 343t, and the second test wavelength conversion pattern 345t may not be disposed in the second dummy pixel area DP2. The second display substrate 30 of the second dummy pixel area DP2 will be described in more detail with reference to FIG. 11.

Referring to FIG. 11, a light blocking layer 390, a first test color filter 331t, a second test color filter 333t, and a third test color filter 335t, which overlap the second dummy pixel area DP2, may be arranged or disposed on one or a surface of the second substrate 310. For example, the color filter layer 330 may include a first test color filter 331t, a second test color filter 333t, and a third test color filter 335t.

The first test color filter 331t may be made of the same or similar material as the first color filter (331 in FIG. 4), the second test color filter 333t may be made of the same or similar material as the second color filter (333 in FIG. 4), and the third test color filter 335t may be made of the same or similar material as the third color filter (335 of FIG. 4).

A first capping layer PS1 may be disposed on the first test color filter 331t, the second test color filter 333t, and the third test color filter 335t, and a second capping layer PS2 may be disposed on the first capping layer PS1. Accordingly, in the second dummy pixel area DP2, the color filter layer 330 may be in direct contact with one or a surface of the second substrate 310 and the light blocking layer 390. Further, the first capping layer PS1 may be in direct contact with the color filter layer 330 and the second capping layer PS2.

A portion of the first capping layer PS1 overlapping the first test color filter 331t, the second test color filter 333t, and the third test color filter 335t may be in direct contact with the second substrate 310.

Further, a portion of the second capping layer PS2 overlapping the first test color filter 331t, the second test color filter 333t, and the third test color filter 335t may be in direct contact with the first capping layer PS1.

For example, in the first dummy pixel area DP1, the first capping layer PS1 and the second capping layer PS2 may not be in direct contact with each other, whereas in the second dummy pixel area DP2, the first capping layer PS1 and the second capping layer PS2 may be in direct contact with each other.

The second dummy pixel area DP2 may include a plurality of sub-dummy pixel areas. For example, the second dummy pixel area DP2 may include a fourth sub-dummy pixel area DP21, a fifth sub-dummy pixel area DP22, and a sixth sub-dummy pixel area DP23. In an embodiment, the fourth sub-dummy pixel area DP21, the fifth sub-dummy pixel area DP22, and the sixth sub-dummy pixel area DP23 may be sequentially arranged or disposed along a direction parallel to the second direction d2.

The second dummy light emission area DLA2 may include a fourth sub-dummy light emission area DLA21, a fifth sub-dummy light emission area DLA22, and a sixth sub-dummy light emission area DLA23.

The fourth sub-dummy pixel area DP21 may include a fourth sub-dummy light emission area DLA21 and a dummy non-light emission area DLB around the fourth sub-dummy light emission area DLA21, the fifth sub-dummy pixel area DP22 may include a fifth sub-dummy light emission area DLA22 and a dummy non-light emission area DLB around the fifth sub-dummy light emission area DLA22, and the sixth sub-dummy pixel area DP23 may include a sixth sub-dummy light emission area DLA23 and a dummy non-light emission area DLB around the sixth sub-dummy light emission area DLA23. Moreover, the second dummy light transmission area DPA2 disposed in the second display substrate 30 may include a fourth sub-dummy light emission area DPA21 overlapping the fourth sub-dummy light emission area DLA21, a fifth sub-dummy light emission area DPA22 overlapping the fifth sub-dummy light emission area DLA22, and a sixth sub-dummy light emission area DPA23 overlapping the sixth sub-dummy light emission area DLA23.

The first test color filter 331t may overlap the fourth sub-dummy transmission area DPA21, the second test color filter 333t may overlap the fifth sub-dummy transmission area DPA22, and the third test color filter 335t may overlap the sixth sub-dummy transmission area DPA23.

In a case that light emitted from the fourth sub-dummy light transmission area DPA21 is acquired and the characteristics of the first test color filter 331t are inspected based on the light, the characteristics of the first color filter (331 in FIG. 4) overlapping the effective pixel area AP may be confirmed. In a case that light emitted from the fifth sub-dummy light transmission area DPA22 is acquired and the characteristics of the second test color filter 333t are inspected based on the light, the characteristics of the second color filter (333 in FIG. 4) overlapping the effective pixel area AP may be confirmed. In a case that light emitted from the sixth sub-dummy light transmission area DPA23 is acquired and the characteristics of the third test color filter 335t are inspected based on the light, the characteristics of the third color filter (335 in FIG. 4) overlapping the effective pixel area AP may be confirmed.

For example, the characteristics of the first to third color filters 331, 333, and 335 may be confirmed in a state in which the first display substrate 10 and the second display substrate 30 are attached to each other. Accordingly, as described above, it may be possible to easily monitor the reduction in efficiency of the display device 1 that may occur after the first display substrate 10 and the second display substrate 30 may be attached to each other.

Descriptions of the first test color filter 331t, the second test color filter 333t, and the third test color filter 335t may be substantially the same as the descriptions of the first to third color filters 331, 333, and 335 described with reference to FIGS. 3 and 4, redundant contents may be omitted.

Referring to FIG. 9 again, the third dummy pixel area DP3 may be an inspection dummy pixel area for measuring the light emission efficiency of the test light emitting element ED. In this case, the test light transmission pattern 341t, the first test wavelength conversion pattern 343t, the second test wavelength conversion pattern 345t, the first test color filter 331t, the second test color 333t, and the third test color filter 335t may not be arranged or disposed in the third dummy pixel area DP3.

By way of example, the light blocking layer 390 may be disposed on the second substrate 310 of the third dummy pixel area DP3, the first capping layer PS1 may be disposed on the light blocking layer 390, and the first capping layer may be disposed on the second capping layer PS2. Accordingly, the first capping layer PS1 of the third dummy pixel area DP3 may be in direct contact with one or a surface of the second substrate 310 and the second capping layer PS2.

As described above, the test light transmission pattern 341t, the first test wavelength conversion pattern 343t, the second test wavelength conversion pattern 345t, the first test color filter 331t, the second test color filter 333t, and the third test color filter 335t may not be arranged or disposed in the third dummy pixel area DP3. Accordingly, in a case that inspecting the characteristics of blue light provided from the test light emitting element ED, the characteristics of the light emitting elements (ED1, ED2, and ED3 in FIG. 4) overlapping the effective pixel area AP may be confirmed. Thus, the light emission efficiency of the test light emitting element ED may be measured in a state in which the first display substrate 10 and the second display substrate 30 are attached to each other. Therefore, it may be possible to easily monitor the reduction in efficiency of the display device 1 that may occur after the first display substrate 10 and the second display substrate 30 may be attached to each other.

Hereinafter, the second test pixel area TP2 will be described in more detail.

Figure 12:
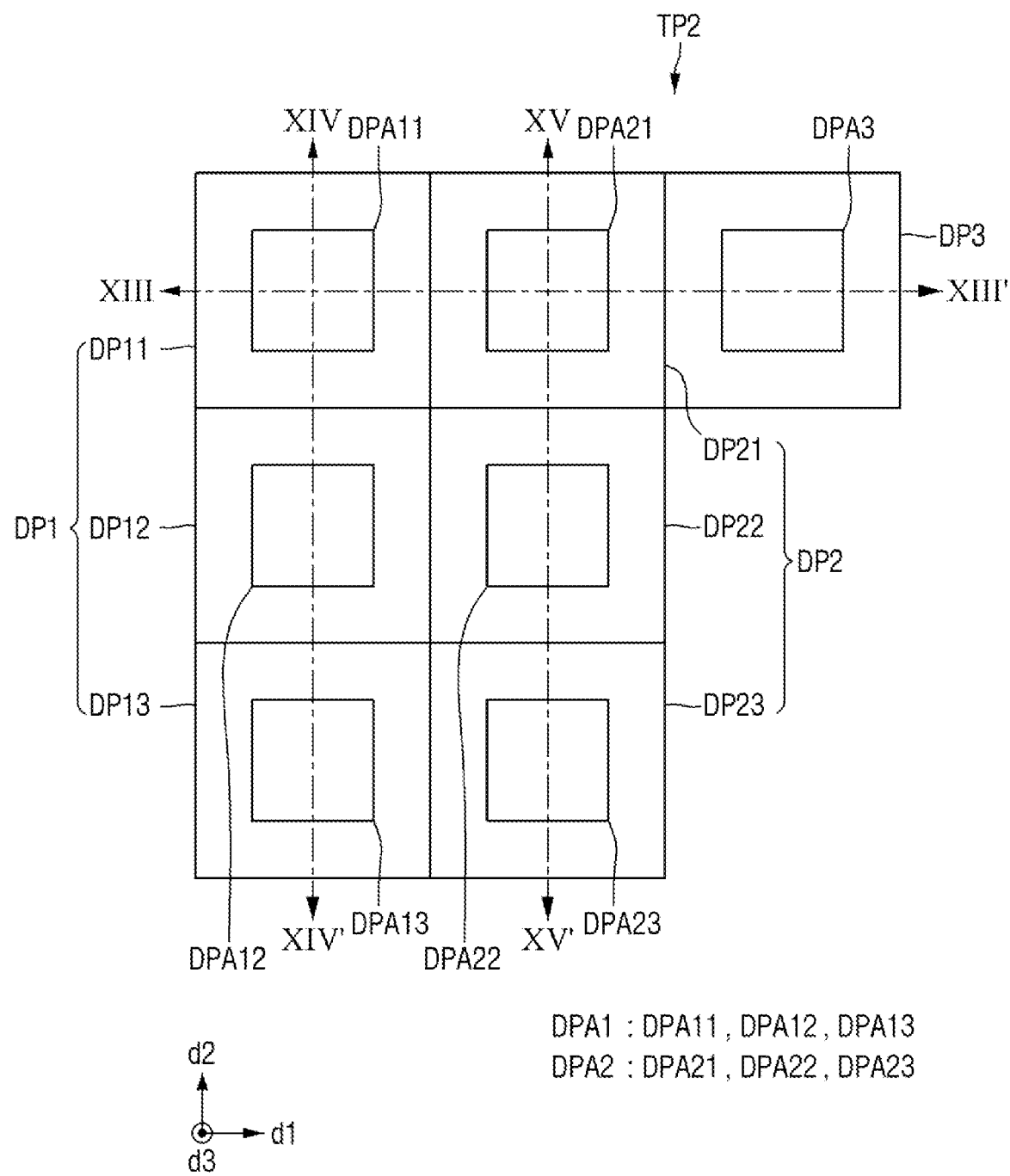
FIG. 12 is an enlarged plan view of the second test pixel area in FIG. 2.
Figure 13:
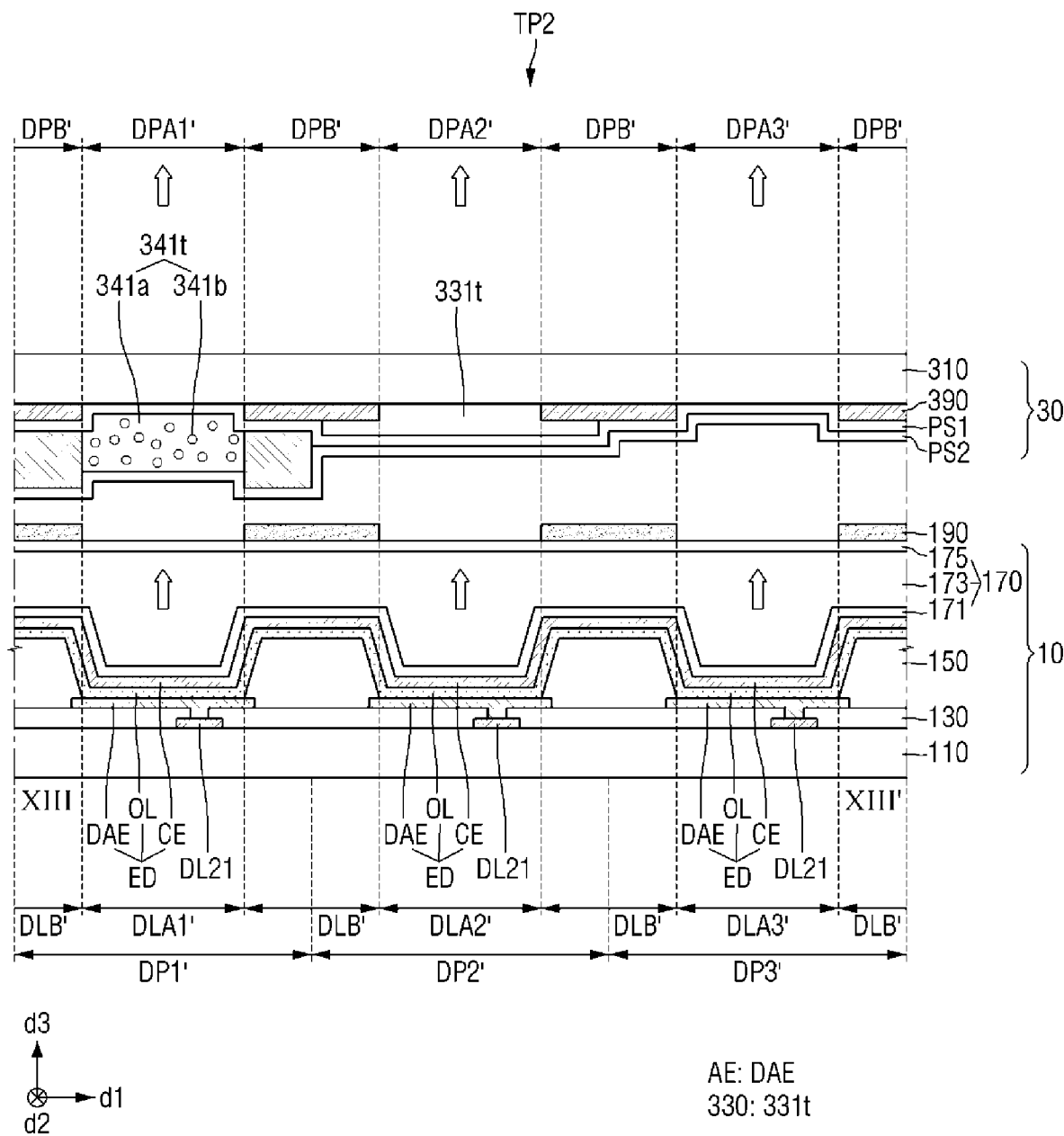
FIG. 13 is a schematic cross-sectional view taken along the line XIII-XIII' in FIG. 12.
Figure 14:
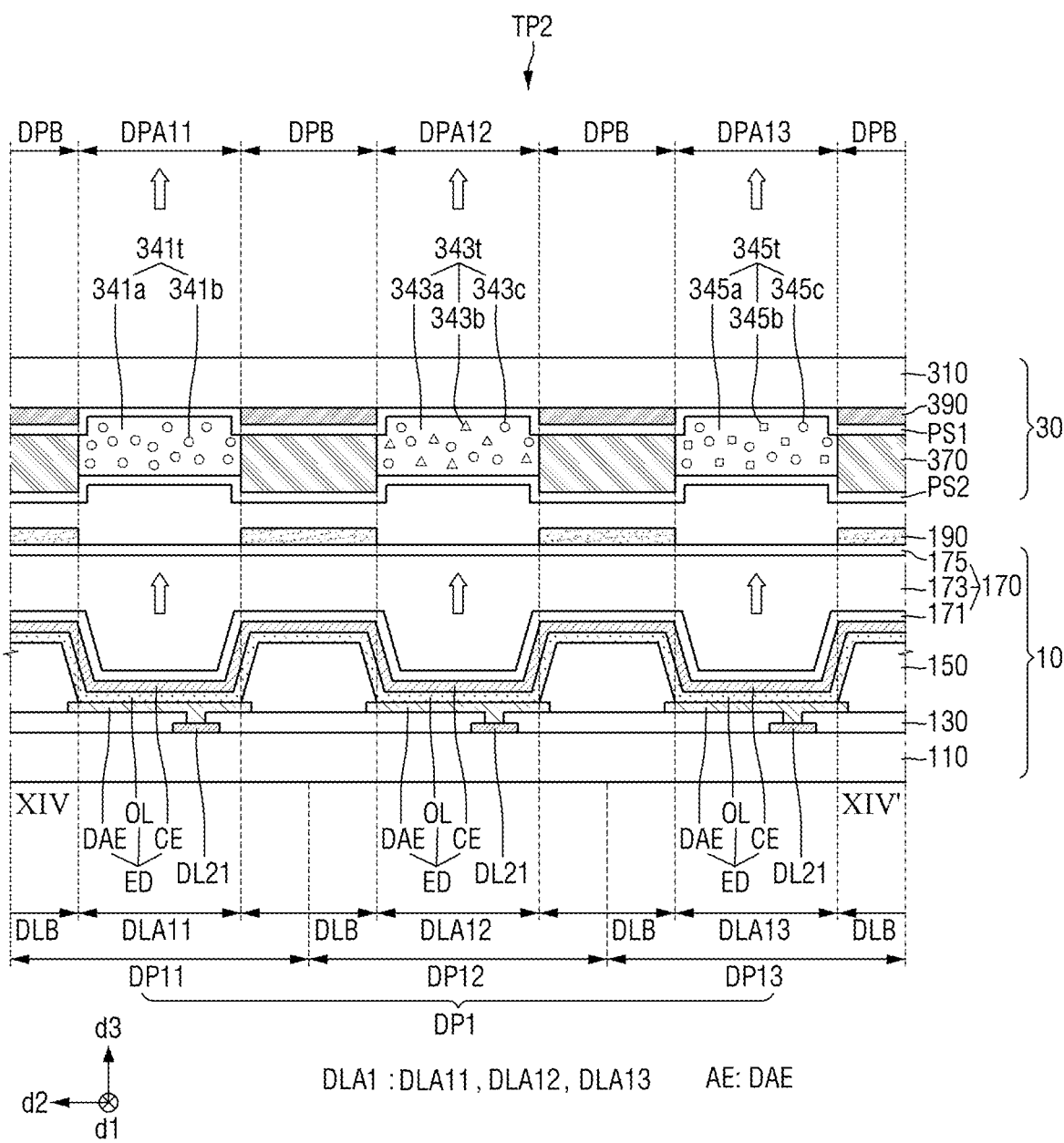
FIG. 14 is a schematic cross-sectional view taken along the line XIV-XIV' in FIG. 12.
Figure 15:
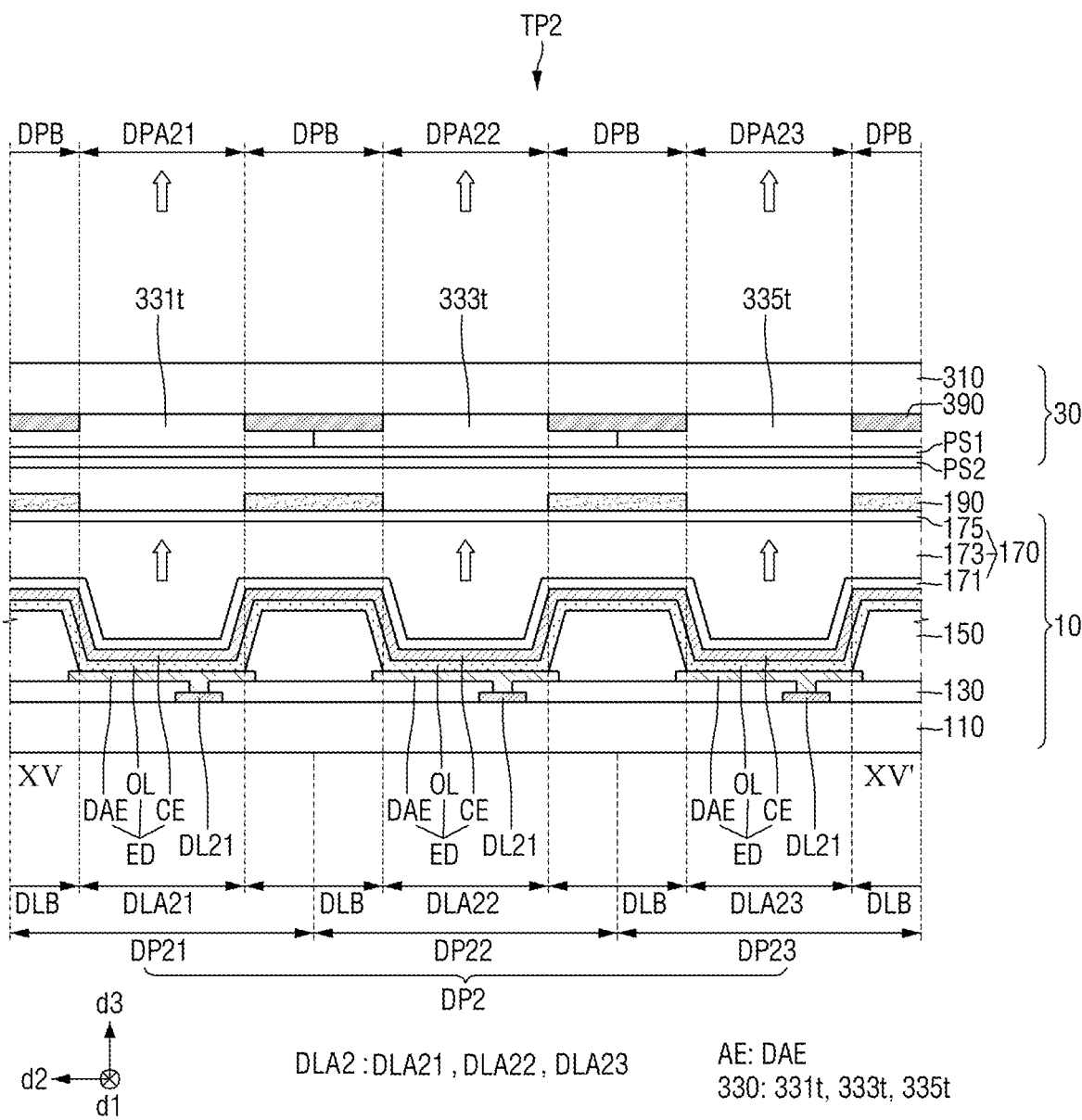
FIG. 15 is a schematic cross-sectional view taken along the line XV-XV' in FIG. 12.

FIG. 12 is an enlarged plan view of the second test pixel area in FIG. 2, FIG. 13 is a schematic cross-sectional view taken along the line XIII-XIII' in FIG. 12, FIG. 14 is a schematic cross-sectional view taken along the line XIV-XIV' in FIG. 12, and FIG. 15 is a schematic cross-sectional view taken along the line XV-XV' in FIG. 12.

Referring to FIGS. 12 to 15, the second test pixel area TP2 may be located or disposed in the second non-display area NDA2, and the second test pixel area TP2 may not overlap the filling layer 70. In other words, the second test pixel area TP2 may be different from the first test pixel area TP1 in that the filling layer 70 may not be disposed between the first display substrate 10 and the second display substrate 30 in the second test pixel area TP2. In an embodiment, there may be a space between the first display substrate 10 and the second display substrate 30 in the second test pixel area TP2. Hereinafter, redundant contents may be omitted, and differences will be mainly described except that FIG. 13 illustrates a dummy light blocking area DPB', a first dummy light transmission area DPA1', a second dummy light transmission area DPA2', a third dummy light transmission area DPA3', a dummy non-light emission area DLB', a first dummy light emission area DLA1', a second dummy light emission area DLA2', a third dummy light emission area DLA3', a first dummy pixel area DP1', a second dummy pixel area DP2', and a third dummy pixel area DP3'.

The second test pixel area TP2 may have substantially the same structure as the first test pixel area TP1. In an embodiment, like the first test pixel area TP1, the second test pixel area TP2 may include a first dummy pixel area DP1, a second dummy pixel area DP2, and a third dummy pixel area DP3.

Since more detailed descriptions of the first dummy pixel area DP1, the second dummy pixel area DP2, and the third dummy pixel area DP3 may be the same as those described above in the description of the first test pixel area, and detailed descriptions thereof may be omitted.

A portion of the second display substrate 30 overlapping the second test pixel area TP2 may include a first dummy light transmission area DPA1, a second dummy light transmission area DPA2, and a third dummy light transmission area DPA3. Since more detailed descriptions of the first dummy light transmission area DPA1, the second dummy light transmission area DPA2, and the third dummy light transmission area DPA3 may be the same as those described above in the description of the first test pixel area, and detailed descriptions thereof may be omitted.

A second dummy line (DL2 in FIG. 4) overlapping the second test pixel area TP2 may be located or disposed on the first substrate 110, and may include a first inspection line DL21 and a second inspection line (DL22 in FIG. 4. More detailed descriptions of the first inspection line DL21 and the second inspection line (DL22 in FIG. 4) may be substantially the same as or similar to the descriptions of the first inspection line (DL11 in FIG. 4) and the second inspection line (DL12 in FIG. 4) of the first dummy line (DL1 in FIG. 4). Therefore, detailed descriptions thereof may be omitted.

As described above, the filling layer 70 may be disposed between the first display substrate 10 and the second display substrate 30 in the first test pixel region TP1, whereas the filling layer 70 may not be disposed between the first display substrate 10 and the second display substrate 30 in the second test pixel area TP2. Accordingly, a change in light efficiency according to the presence or absence of the filling layer 70 may be confirmed by comparing the characteristics of the light emitted from the first test pixel area TP1 with the characteristics of the light emitted from the second test pixel area TP2. For example, since the light efficiency according to the presence or absence of the filling layer 70 may be measured in a state in which the first display substrate 10 and the second display substrate 30 may be attached to each other, as described above, it may be possible to easily monitor the reduction in efficiency of the display device 1 that may occur after the first display substrate 10 and the second display substrate 30 may be attached to each other.

The effects of the disclosure are not limited by the foregoing, and other various effects are anticipated herein.

Although embodiments disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A display device, comprising:
a first substrate including a display area including a first effective pixel area and a non-display area including a test pixel area;
a first light emitting element disposed on the first substrate and overlapping the first effective pixel area of the display area;
a plurality of test light emitting elements disposed on the first substrate and overlapping the test pixel area of the non-display area;
a second substrate facing the first substrate;
a first color filter disposed on the second substrate and overlapping the first light emitting element;
a first wavelength conversion pattern disposed on the first color filter, the first wavelength conversion pattern overlapping the first color filter and the first light emitting element;
a first test color filter disposed on the second substrate and overlapping one of the plurality of test light emitting elements; and
a first test wavelength conversion pattern disposed on the second substrate and overlapping another one of the plurality of test light emitting elements, wherein
the first test wavelength conversion pattern and the first wavelength conversion pattern include a same first wavelength conversion material, and
the first test color filter and the first color filter include a same first color colorant.

2. The display device of claim 1, wherein the first test color filter and the first test wavelength conversion pattern do not overlap each other.

3. The display device of claim 2, further comprising:
a first capping layer disposed on the second substrate, wherein
a first portion of the first capping layer overlapping the first effective pixel area is disposed between the first color filter and the first wavelength conversion pattern,
a second portion of the first capping layer overlapping the first test wavelength conversion pattern is disposed between the second substrate and the first test wavelength conversion pattern,
the second portion of the first capping layer directly contacts the second substrate, and a third portion of the first capping layer overlapping the first test color filter overlaps the first test color filter.

4. The display device of claim 1, further comprising:
a second capping layer overlapping the first wavelength conversion pattern and the first test wavelength conversion pattern,
wherein a portion of the second capping layer overlapping the first test color filter directly contacts the first capping layer.

5. The display device of claim 1, further comprising:
a light blocking layer disposed on the second substrate,
wherein the light blocking layer is disposed between the first test wavelength conversion pattern and the first test color filter.

6. The display device of claim 1,
wherein the test pixel area of the non-display area includes a first dummy pixel area overlapping the first test wavelength conversion pattern, a second dummy pixel area overlapping the first test color filter, and a third dummy pixel area overlapping the first test wavelength conversion pattern and the first test color filter.

7. The display device of claim 6, further comprising:
a first capping layer disposed on the second substrate and overlapping the first test color filter and the first color filter; and
a second capping layer disposed on the first capping layer, the second capping layer overlapping the first test wavelength conversion pattern and the first wavelength conversion pattern; and
a test light emitting element disposed on the first substrate and overlapping the third dummy pixel area, wherein
a portion of the first capping layer overlapping the third dummy pixel area directly contacts the second substrate, and
a portion of the second capping layer overlapping the third dummy pixel area directly contacts the first capping layer.

8. The display device of claim 7, wherein
the display area further includes a second effective pixel area,
the first dummy pixel area includes:
  a first sub-dummy pixel area; and
  a second sub-dummy pixel area, and
the display device further includes:
  a second wavelength conversion pattern disposed on the second substrate and overlapping the second effective pixel area;
  a second test wavelength conversion pattern disposed on the second substrate and overlapping the second sub-dummy pixel area;
  a test light emitting element disposed on the first substrate and overlapping the second test wavelength conversion pattern; and
  a second light emitting element disposed on the first substrate and overlapping the second wavelength conversion pattern,
wherein the second wavelength conversion pattern and the second test wavelength conversion pattern include a same second wavelength conversion material that is different from the first wavelength conversion material.

9. The display device of claim 8, wherein
the second dummy pixel area includes a third sub-dummy pixel area and a fourth sub-dummy pixel area,
the display device further includes:
  a second color filter overlapping the second wavelength conversion pattern and disposed between the second substrate and the second wavelength conversion pattern;
  a second test color filter disposed on the second substrate and overlapping the fourth sub-dummy pixel area; and
  a test light emitting element disposed on the first substrate and overlapping the second test color filter,
wherein the second color filter and the second test color filter include a same second color colorant that is different from the first color colorant.

10. The display device of claim 9, wherein
the first dummy pixel area further includes a fifth sub-dummy pixel area,
the display area further includes a third effective pixel area,
the display device further includes:
  a light transmission pattern disposed on the second substrate and overlapping the third effective pixel area;
  a test light transmission pattern disposed on the second substrate and overlapping the fifth sub-dummy pixel area;
  a test light emitting element disposed on the first substrate and overlapping the test light transmission pattern; and
  a third light emitting element disposed on the first substrate and overlapping the light transmission pattern, and
each of the test light transmission pattern and the light transmission pattern includes a base resin and scatterers dispersed in the base resin.

11. The display device of claim 10, wherein
the second dummy pixel area further includes a sixth sub-dummy pixel area,
the display device further includes:
  a third color filter overlapping the light transmission pattern and disposed between the second substrate and the light transmission pattern;
  a third test color filter disposed on the second substrate and overlapping the sixth sub-dummy pixel area; and
  a test light emitting element disposed on the first substrate and overlapping the third test color filter, and
the third color filter and the third test color filter include a same third color colorant that is different from the first color colorant and the second color colorant.

12. The display device of claim 1, wherein
each of the plurality of test light emitting elements and the first light emitting element includes a light emitting layer, and
the light emitting layer emits blue light.

13. The display device of claim 12, wherein
the first wavelength conversion material includes quantum dots,
each of the test light conversion pattern and the first wavelength conversion pattern includes a base resin and scatterers dispersed in the base resin, and
the quantum dots are dispersed in the base resin.

14. The display device of claim 1, further comprising:
a sealing member surrounding the display area, wherein
the non-display area includes:
  a first non-display area disposed inside the sealing member; and
  a second non-display area disposed outside the sealing member, and the test pixel area is disposed in each of the first non-display area and the second non-display area.

15. The display device of claim 14, further comprising:
a filling layer disposed between the first substrate and the second substrate, wherein
the filling layer overlaps the first non-display area, and
the filling layer does not overlap the second non-display area.

16. A display device, comprising:
a first substrate including a display area including an effective pixel area and a non-display area including a test pixel area;
a light emitting layer disposed on the first substrate and overlapping the test pixel area;
a second substrate facing the first substrate;
a color filter disposed on the second substrate and overlapping the effective pixel area;
a first capping layer disposed on the color filter and overlapping the color filter;
a wavelength conversion pattern disposed on the first capping layer and overlapping the color filter; and
a test color filter and a test wavelength conversion pattern disposed on the second substrate and overlapping the test pixel area, wherein
the test color filter does not overlap the test wavelength conversion pattern,
a portion of the first capping layer overlapping the test wavelength conversion pattern directly contacts the second substrate, and
a portion of the first capping layer overlapping the test color filter does not contact the second substrate.

17. The display device of claim 16, wherein
the test color filter and the color filter include a same material, and
the test wavelength conversion pattern and the wavelength conversion pattern include a same material.

18. The display device of claim 17, further comprising:
a second capping layer overlapping the wavelength conversion pattern and the test wavelength conversion pattern, wherein
a portion of the second capping layer overlapping the test wavelength conversion pattern directly contacts the test wavelength conversion pattern, and
a portion of the second capping layer overlapping the test color filter directly contacts the first capping layer.

19. The display device of claim 18, wherein
the test pixel area includes:
a first dummy pixel area overlapping the test wavelength conversion pattern;
a second dummy pixel area overlapping the test color filter; and
a third dummy pixel area not overlapping the test wavelength conversion pattern and the test color filter,
a portion of the first capping layer overlapping the third dummy pixel area directly contacts the second substrate, and
a portion of the second capping layer overlapping the third dummy pixel area directly contacts the first capping layer.

20. The display device of claim 18, wherein
the test wavelength conversion pattern and the wavelength conversion pattern include same quantum dots, and
the light emitting layer emits blue light.

\* \* \* \* \*